(12) United States Patent
Kamijima

(10) Patent No.: US 7,869,476 B2
(45) Date of Patent: Jan. 11, 2011

(54) LIGHT SOURCE DEVICE, PROJECTOR DEVICE, MONITOR DEVICE, AND LIGHTING DEVICE

(75) Inventor: Shunji Kamijima, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/662,588

(22) Filed: Apr. 23, 2010

(65) Prior Publication Data

US 2010/0208758 A1 Aug. 19, 2010

Related U.S. Application Data

(63) Continuation of application No. 12/003,843, filed on Jan. 2, 2008, now Pat. No. 7,733,931.

(30) Foreign Application Priority Data

Jan. 9, 2007 (JP) ............... 2007-001571
Dec. 6, 2007 (JP) ............... 2007-315577

(51) Int. Cl.
*H01S 3/00* (2006.01)
*H01S 3/04* (2006.01)
*H01S 3/13* (2006.01)

(52) U.S. Cl. ............... 372/34; 372/29.021; 372/33
(58) Field of Classification Search ............ 372/29.021, 372/33, 34, 38.02
See application file for complete search history.

(56) References Cited

U.S. PATENT DOCUMENTS

2006/0165140 A1 7/2006 Tan et al.

FOREIGN PATENT DOCUMENTS

| JP | A-05-313115 | 11/1993 |
|----|-------------|---------|
| JP | A-2005-189323 | 7/2005 |
| JP | A-2006-091132 | 4/2006 |

*Primary Examiner*—Armando Rodriguez
(74) *Attorney, Agent, or Firm*—Oliff & Berridge, PLC

(57) ABSTRACT

The controller 170 controls the output power of the semiconductor laser device 100a depending on the temperature of the semiconductor laser device 100a acquired by the temperature sensor 130. The controller 170 references the correspondence table 510 when the sensor temperature Ts is obtained, obtains the output power PWs corresponding to the sensor temperature Ts, and controls the power supply driving circuit 150a so that the output power per unit time of the semiconductor laser device 100a will be the output power PWs. Thus increase in temperature of the semiconductor laser device is able to be prevented through reducing the output power by controlling the amount of power supplied to the semiconductor laser device. As a result, it is possible to prevent reductions in the service life of the semiconductor laser device, even when there is a failure in a cooling device that cools the semiconductor laser device, and even when the device is used in a high temperature environment not envisioned at the time of manufacturing.

10 Claims, 18 Drawing Sheets

| TEMPERATURE | TARGET POWER | | |
|---|---|---|---|
| | R | G | B |
| A | aR | aG | aB |
| B | bR | bG | bB |
| C | cR | cG | cB |
| D | dR | dG | dB |
| E | eR | eG | eB |
| F | fR | fG | fB |

LIGHT SOURCE DEVICE, PROJECTOR DEVICE, MONITOR DEVICE, AND LIGHTING DEVICE

CROSS-REFERENCE TO RELATED APPLICATIONS

This application is a continuation of U.S. patent application Ser. No. 12/003,843, filed Jan. 2, 2008, and claims the priority based on Japanese Patent Application No. 2007-001571 filed on Jan. 9, 2007, Japanese Patent Application No. 2007-315577 filed on Dec. 6, 2007, the disclosures of which are hereby incorporated by reference in their entirety.

BACKGROUND

1. Technical Field

The present invention relates to a light source device and to an image display device, a monitor device, and a lighting device comprising the light source device.

2. Related Art

Image display devices are in use wherein images are displayed by illuminating, with an illumination beam from a light source device, spatial optical modulator devices such as light valves and digital mirror devices (DMDs). The image display devices use a laser beam source that emits laser beams, for example, as a light source.

The laser beam source produces heat through its operation, where the temperature of the device itself increases with the time of operation. In order to prevent a reduction in the service life of the laser beam source device due to increased temperatures, image display devices are provided with, for example, cooling devices for cooling the laser beam sources.

However, there are concerns that the temperature of the laser beam source may exceed the tolerable temperature due to a failure in the cooling device, for example, or due to use of the image display device in an environment exceeding the tolerable temperature at which stable operation of the laser beam source is possible. When the temperature of the laser beam source exceeds the tolerable temperature, then there is the problem that the output power of the laser beam source falls quickly when compared to the case of stable operation. Furthermore, the higher the operating temperature of the laser beam source, the shorter the period which the laser beam source is able to emit a stable laser beam, or in other words, the shorter the service life of the laser beam source.

The issue described above is not an issue that is limited to image display devices that use laser beam source devices, but rather is an issue that can occur also in monitor devices and lighting devices that use laser beam source devices.

SUMMARY

The present invention is the result of contemplation on the problem areas described above, and the object thereof is to prevent the rapid drop in the output of the laser beam source.

The present invention provides at least a partial solution to the problems described above.

A first aspect of the present invention provides a light source device, the light source device includes a light source that emits a laser beam; a driving circuit that supplies electric power for driving the light source; an acquirer that acquires the temperature of the light source; and a controller that controls the driving circuit so as to reduce the power supplied per unit time to the light source from the driving circuit when the acquired light source temperature is greater than a first predetermined threshold value.

The light source device in the first aspect of the present invention is able to prevent the increase in temperature of the light source by reducing the power to be supplied to the light source depending on the temperature of the light source. Consequently, the brightness of the light that is outputted from the light source is able to be maintained without a sudden decrease in brightness over a short time period to the degree that would make the device unusable.

A second aspect of the present invention provides a image display device, the image display device includes the light source device of the first aspect of the present invention.

The image display device of the second aspect of the present invention is able to structure an image display device capable of maintaining the power of the light that is outputted from the light source without any sudden decrease in brightness.

A third aspect of the present invention provides a monitor device, the monitor device includes the light source device of the first aspect of the present invention.

The monitor device of the third aspect of the present invention is able to structure a monitor device capable of maintaining the power of the light that is outputted from the light source without any sudden decrease in brightness.

A fourth aspect of the present invention provides a lighting device, the lighting device includes the light source device of the first aspect of the present invention.

The lighting device of the fourth aspect of the present invention is able to structure a lighting device capable of maintaining the power of the light that is outputted from the light source without any sudden decrease in brightness.

These and other objects, features, aspects, and advantages of the present invention will become more apparent from the following detailed description of the preferred embodiments with the accompanying drawings.

BRIEF DESCRIPTION OF THE DRAWINGS

FIG. 15 illustrates an explanatory diagram of a target output power table in the fifth embodiment.

DESCRIPTION OF THE PREFERRED EMBODIMENT

A. First Embodiment

A1. Summary of System

Figure 1:
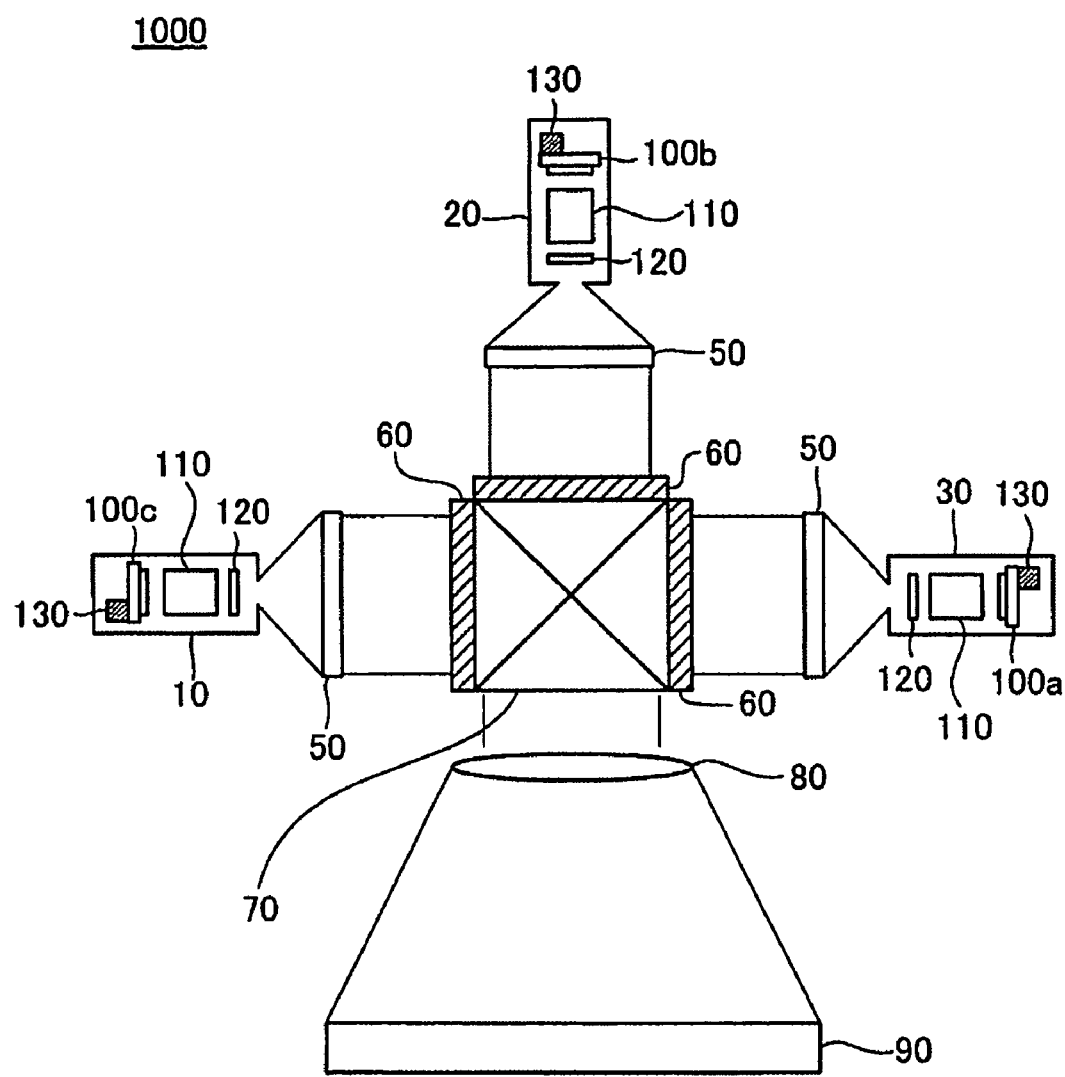
FIG. 1 illustrates an explanatory diagram of a schematic structure of a projector as set forth in a first embodiment.
Figure 2:
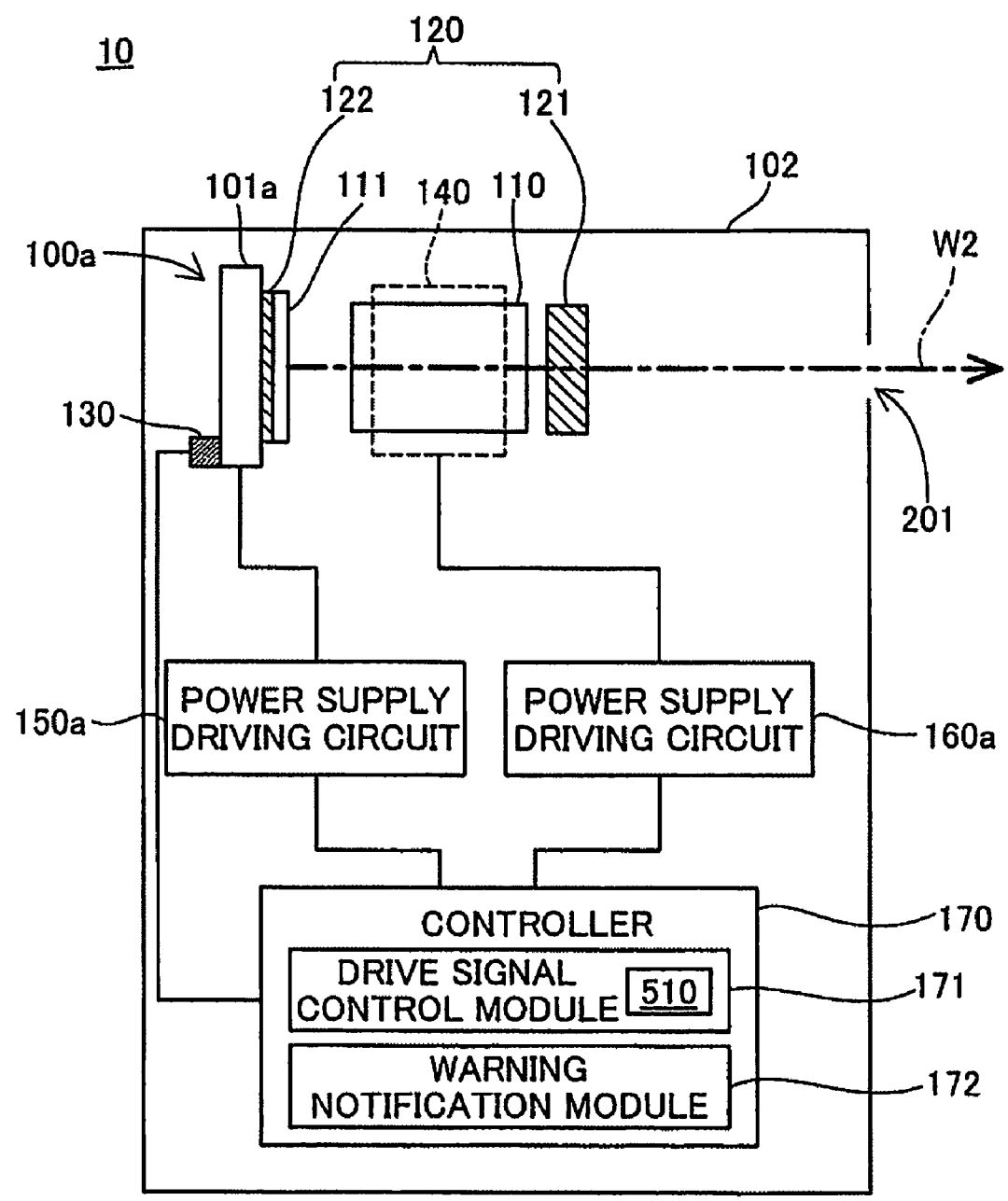
FIG. 2 illustrates a block diagram of the structure of a light source device as set forth in the first embodiment.
Figure 3:
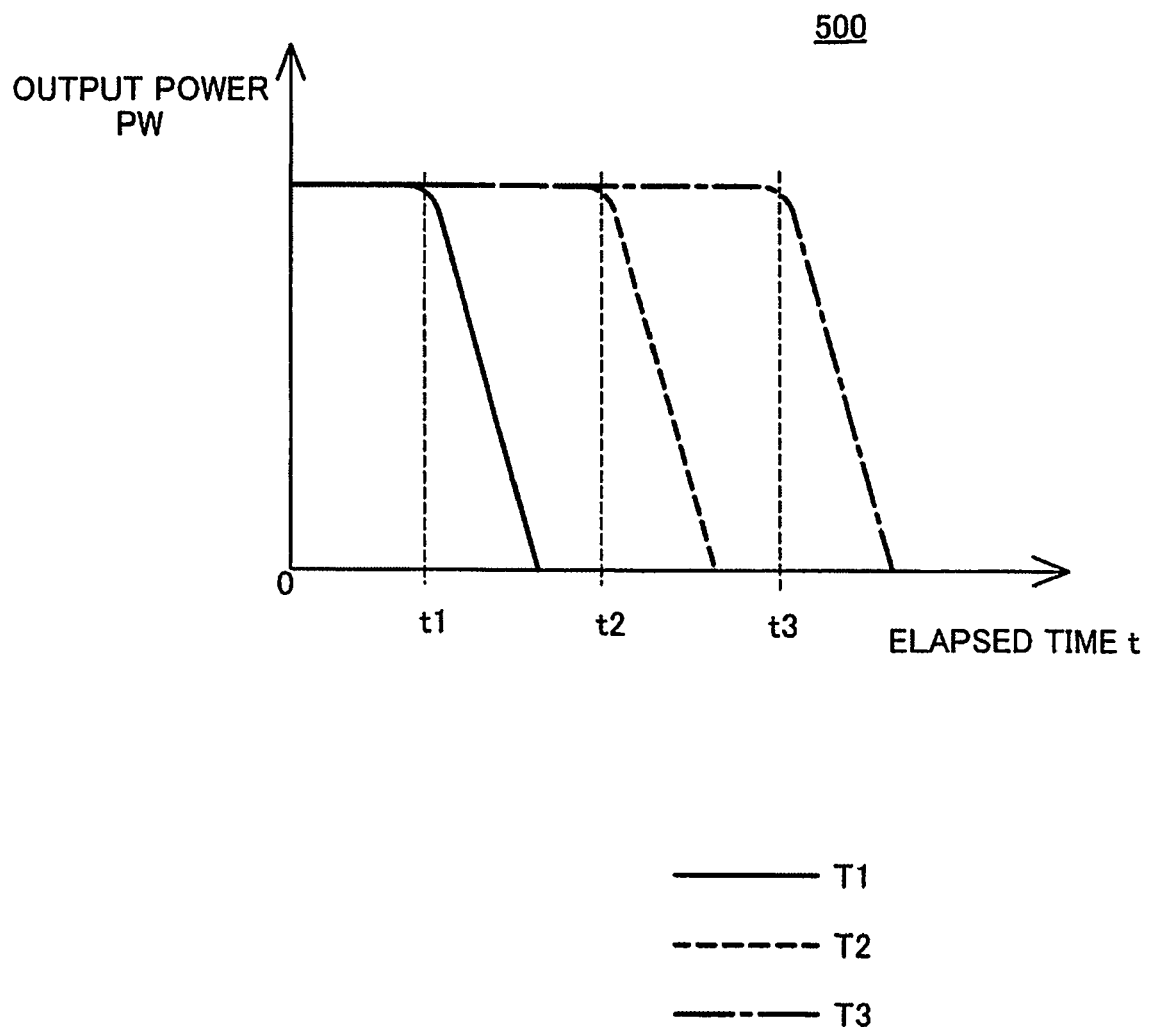
FIG. 3 shows a correlation graph of the relationship between the output power and the temperature of the semiconductor laser device.

A projector will be described, in reference to FIG. 1 through FIG. 3, as an image display device in a first embodiment. FIG. 1 is an explanatory diagram illustrating the schematic structure of the projector in the first embodiment. FIG. 2 is a block diagram illustrating the structure of the light source device in the first embodiment.

As is shown in FIG. 1, a projector 1000 comprises light source devices 10, 20, and 30, homogenizing optical elements 50, light valves 60, a dichroic prism 70, and a projection lens 80.

The light source devices 10, 20, and 30 are used as light sources for the projector 1000. The light source device 10 outputs a red laser beam having a wavelength of approximately 650 nm; the light source device 20 outputs a green laser beam having a wavelength of approximately 540 nm; and the light source device 30 outputs a blue laser beam having a wavelength of approximately 430 nm. Note that because the laser beams are absorbed by various mechanisms within the beam source device, there is some minor difference between the optical fluxes of the beams outputted from the semiconductor laser devices and the optical fluxes of the beams that are used in projecting the image. The structures of the beam source devices 10, 20, and 30 will be described in detail later.

The homogenizing optical elements 50 average the non-uniformities in brightness by superimposing the illumination beams that are incident thereon, thereby reducing the difference in the brightness between the edge portions and the center portion of the screen. The homogenizing optical elements 50 project an image with overall brightness onto the screen. In the present embodiment, diffraction optical elements are used as the homogenizing optical elements 50.

The light valves 60 are formed using high-temperature polysilicon (HTPS), and are active matrix-drive transmissive liquid crystal panels. The light valves 60 control the incident beam to form the image.

The dichroic prism 70 is structured as four triangular prisms combined together into a rectangular solid, where the red laser beam, the green laser beam, and the blue laser beam that pass through the light valve 60 combine together to form an image, which is projected by the projection lens 80.

The projection lens 80 projects, onto the screen 90, the image that is incident from the dichroic prism 70.

As described above, the projector 1000 forms the image by the respective beams emitted from the light source devices 10, 20, and 30 being incident on the corresponding light valves 60 to form the image, after which the emitted beams are projected onto the screen 90. The viewer views the image that is projected onto the screen 90.

The functional blocks of the light source devices in the first embodiment will be described in reference to FIG. 2. Note that the light source devices 20 and 30 are structured similarly to the light source device 10, aside from the differences in wavelength of the beams emitted, so explanations of the light source devices 20 and 30 will be omitted.

As is shown in FIG. 2, the light source device 10 comprises a frame 102, a semiconductor laser device 100$a$ as a laser beam source, a second harmonic generating element 110, a resonator 120, a temperature sensor 130, a temperature adjusting device 140, a power supply driving circuit 150$a$, a temperature adjusting module 160$a$, and a controller 170. The controller 170 comprises a drive signal control module 171 and a warning notification module 172.

The semiconductor laser device 100$a$ of the light source device 10 outputs a laser beam with a peak frequency of approximately 1300 nm, which is twice the approximate 650 nm that is the peak wavelength of the red laser beam. Note that the semiconductor laser device of the light source device 20 outputs a laser beam with a peak wavelength of approximately 1080 nm, which is twice the approximate 540 nm that is the peak wavelength of the green laser beam, and the semiconductor laser device of the light source device 30 outputs a laser beam with a peak wavelength of approximately 860 nm, which is twice the approximate 430 nm that is the peak wavelength of the blue laser beam.

The second harmonic generating element 110 is a nonlinear optical element that converts the incident beam to a wavelength of approximately one half of the incident wavelength. The beam that is outputted from the semiconductor laser device 100$a$ towards the resonator 120 is converted to a beam of approximately one half the wavelengths by passing through the second harmonic generating element 110. That is, the infrared laser beams that are outputted from the respective semiconductor laser devices of the light source devices 10, 20, and 30 are converted into visible light by passing through the second harmonic generating element 110. The wavelength conversion efficiency of the second harmonic generating element 110 has nonlinear properties, where, for example, the conversion efficiency increases the stronger the laser beam that is incident into the second harmonic generating element 110. The conversion efficiency of the second harmonic generating element 110 is about 40 to 50%.

The resonator 120 has a pair of mirrors 121 and 122 that reflect a portion of the incident beam. These mirrors 121 and 122 are disposed so as to lie on either side of a light-emitting unit 111. The resonator 120 is structured so that the distance between the resonator mirrors 121 and 122 is an integer multiple of half wavelengths of a specific wavelength, so that light having the specific wavelength resonates between the resonator mirrors to be amplified. Specifically, the mirror 121 that is provided on the beam-emission side of the light-emitting unit 111 reflects, towards the mirror 122, a part (approximately 98 to 99%) of the light of the specific frequency within the incident laser beam, and transmits the remaining part of the laser beam. The mirror 122 reflects towards the mirror 121 the light that is reflected by the mirror 121 that is provided on the light-emitting side of the light-emitting unit 111. In this way, that portion of the light that is incident into the resonator 120 that has the specific wavelength is amplified through repetitively reflecting from the mirrors 121 and 122. The intensity of the amplified laser beam is remarkably high when compared to the intensity of the light of the other wavelengths, so passes through the mirror 121 of the resonator. The amplified laser beam W2 that has passed through the mirror 121 of the resonator is able to be viewed as being essentially single-wavelength. The mirrors 121 and 122 may be fabricated from dielectric multilayer.

The temperature sensor 130 is attached to a base plate 101a of a semiconductor laser device 100a, and measures the temperature of the semiconductor laser device 100a as a beam source. The temperature sensor 130 may be positioned at any location of the semiconductor laser device 100a, but disposal at the base plate enables measurement of the temperature of the semiconductor laser device 100a without interfering with the movement of the beam that is emitted from the light-emitting unit 111 and travels in the direction of the second harmonic generating element 110, and without increasing the fragility of the interface on which the semiconductor laser device is formed, such as through inserting a temperature sensor at the interface between, for example, the light-emitting unit 111 and the resonator mirror 122.

The power supply driving circuit 150a is provided with a correspondence table 510 as relational information, and supplies electric power for causing the semiconductor laser device 100a to emit light. The correspondence table 510 will be described below.

The temperature adjusting device 140 is disposed so as to cover the side surface of the second harmonic generating element 110, essentially parallel with the direction of travel of the laser beam W2, and has a function that adjusts the temperature of the second harmonic generating element 110. The temperature adjusting device 140 is formed from, for example, a Peltier element. The second harmonic generating element 110 absorbs the laser beam that is traveling back and forth within the resonator 120, and thus the temperature thereof increases, where the temperature of the crystal rises accordingly, disrupting the phase-lock conditions. The result is that the wavelength conversion efficiency of the second harmonic generating element 110 may drop, and thus the temperature adjusting device 140 is provided to prevent the change in temperature of the second harmonic generating element 110.

The temperature adjusting module 160a controls the operation of the temperature adjusting device 140, to adjust, to a predetermined temperature, the temperature of the second harmonic generating element 110.

The controller 170 controls the output power of the semiconductor laser device 100a depending on the temperature of the semiconductor laser device 100a acquired by the temperature sensor 130. Additionally, the warning notification module 172 displays a warning to the screen 90, through the light valve 60, when the temperature of the base plate, acquired through the temperature sensor 130, is higher than a predetermined threshold value.

A2. The Relationship Between the Temperature of the Semiconductor Laser Device and the Output Power Prior to explaining the detailed processes of the light source device in the first embodiment, the relationship between the temperature of the semiconductor laser device and the output power will be explained in reference to FIG. 3. FIG. 3 is a correlation graph illustrating the relationship between the temperature of the semiconductor laser device and the output power.

The correlation graph 500 illustrates the relationship between the output power and the operating time of the semiconductor laser device 100a operating at three different temperatures T1, T2, and T3 (where T1>T2>T3). Note that in the present embodiment the output power indicates the brightness. The correlation graph 500 shows the output power PW of the semiconductor laser device 100a on the vertical axis, and shows the elapsed time t on the horizontal axis. The relationship between the output power PW of the semiconductor laser device and the elapsed time at temperature T1 is shown by the solid line, the relationship between the output power PW of the semiconductor laser device and the elapsed time at temperature T2 is shown by the dashed line, and the relationship between the output power PW of the semiconductor laser device and the elapsed time at temperature T3 is shown by the alternating long and short dash line.

The semiconductor laser device, when used continuously over a long period of time, ceases to emit light due to fracturing of the package, separation of the interface between the base plate and the mirror 122 of the resonator, failure of the semiconductor chip, or the like. The service life of the semiconductor laser device (where, in the present embodiment, the service life of the device indicates the time over which light is emitted at a specific brightness) is correlated with operating temperature and, as shown in the correlation graph 500, the semiconductor laser device that emits light at the temperature T1 damages at time t1, its output begins to drop abruptly, the service life comes to an end, and the output power goes to zero. Similarly, the semiconductor laser device that emits light at temperature T2 damages at time t2, and its output begins to drop, while the semiconductor laser device that emits light at temperature T3 damages at time t3, and its output begins to drop. (Note that in the first embodiment, t1<t2<t3.) That is, the higher the temperature at which the semiconductor laser device operates, the shorter its service life.

A3. Output Power Control Process

Figure 4:
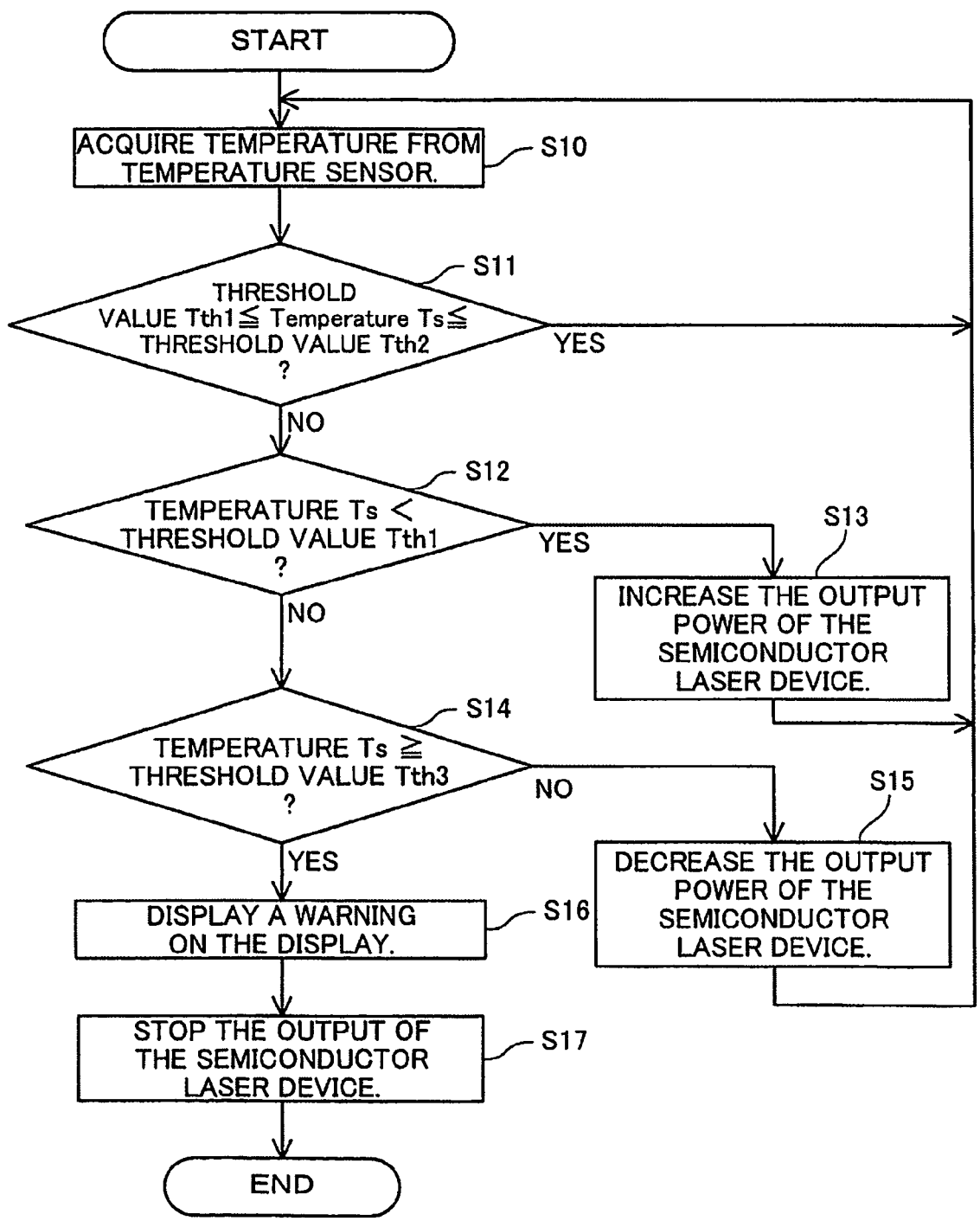
FIG. 4 shows a flowchart of the output power control process for a light source device as set forth in the first embodiment.
Figure 5:
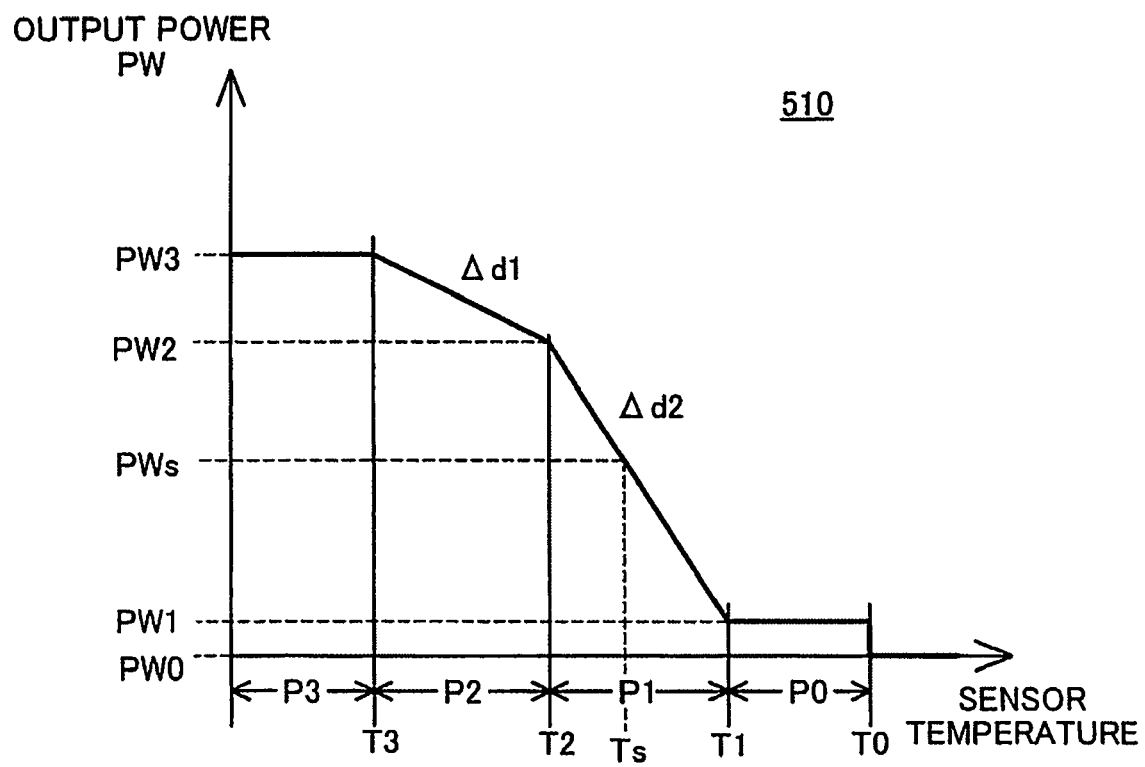
FIG. 5 illustrates a correspondence table of the correspondence between the temperatures of the semiconductor laser devices and the output powers in the first embodiment.
Figure 6:
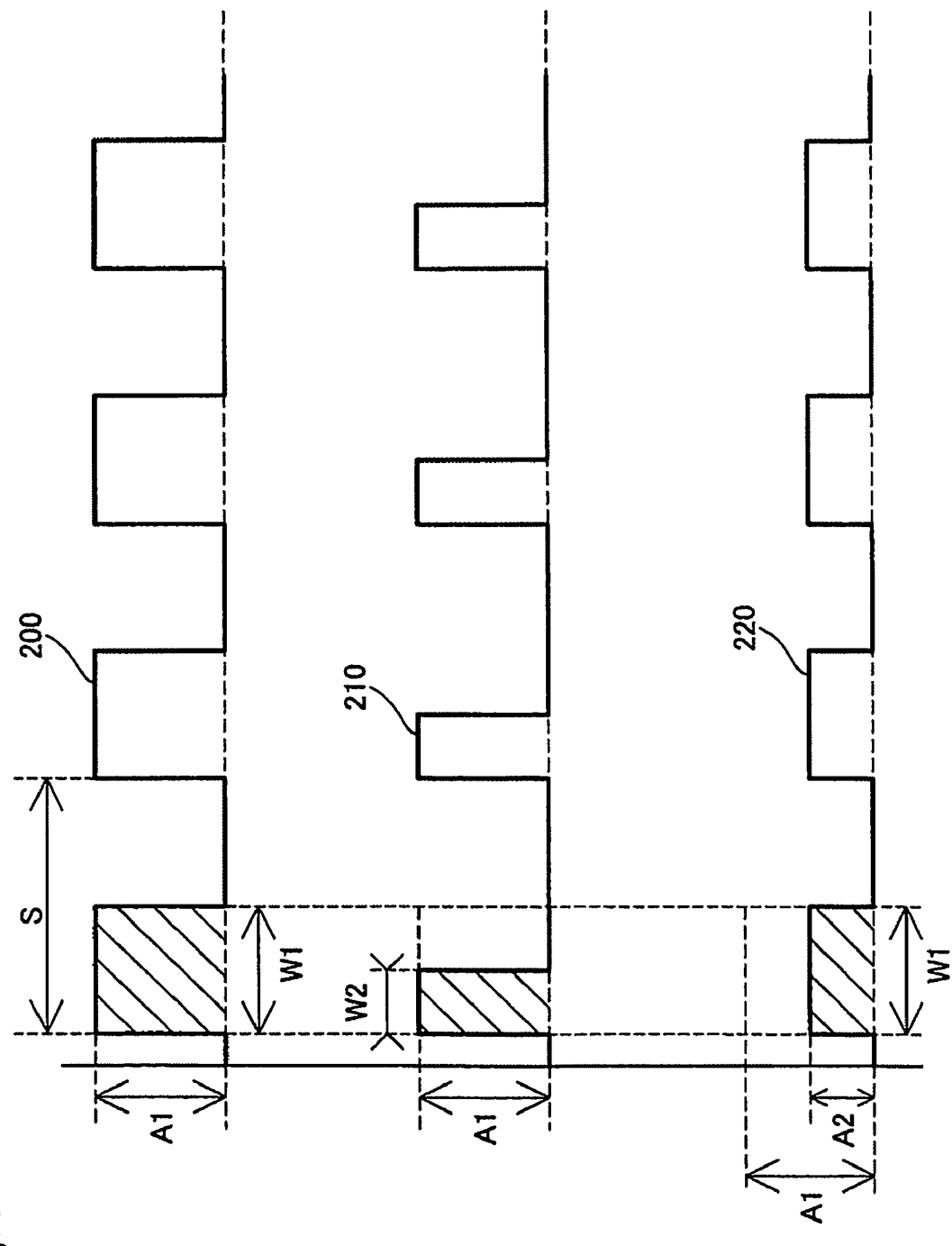
FIG. 6 illustrates an explanatory diagram of the pulses that are generated by the driving circuit in the first embodiment.
Figure 7:
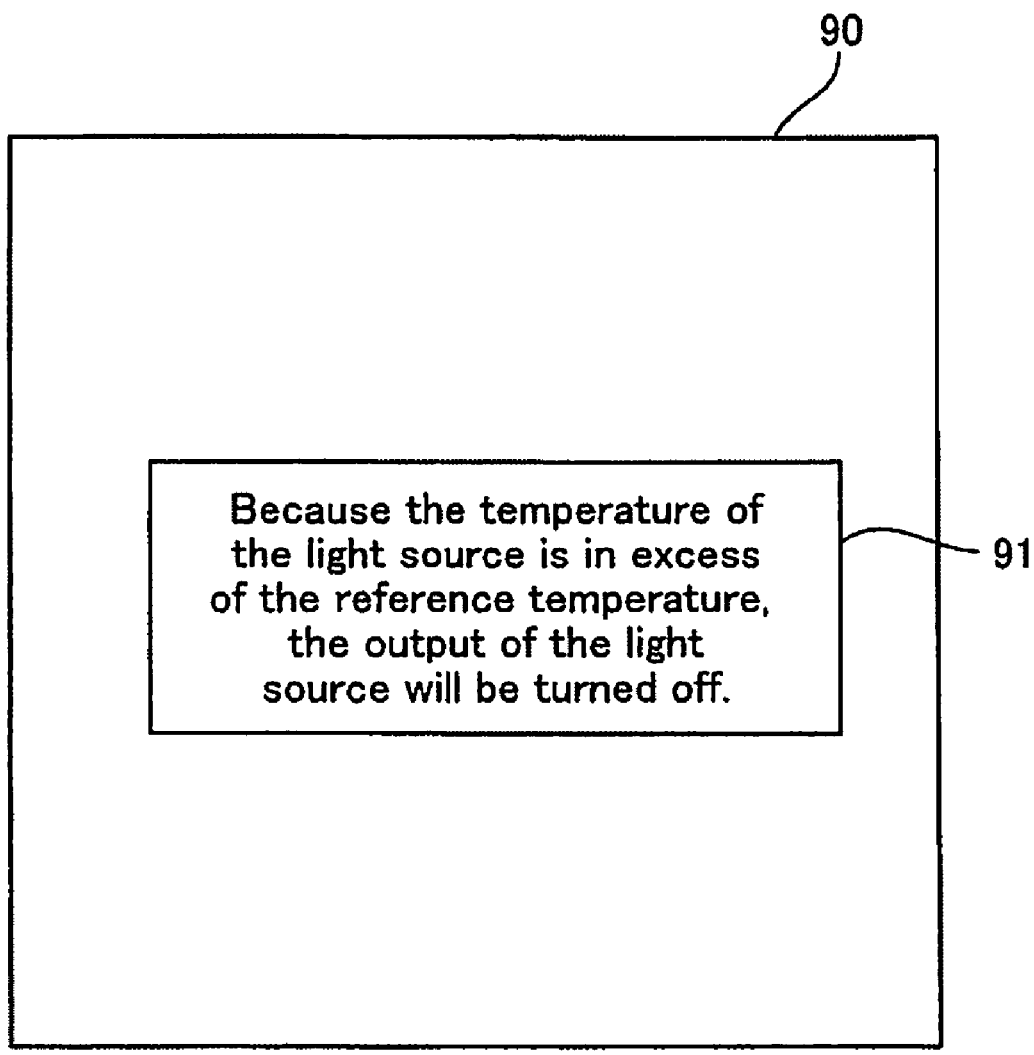
FIG. 7 illustrates an explanatory diagram of a warning notification screen in the first embodiment.

The details of the process in the light source device in the first embodiment will be explained referencing FIG. 4 through FIG. 7. FIG. 4 is a flow chart for explaining the output power control process for the light source device in the first embodiment. FIG. 5 is a correspondence table illustrating the correlation between the temperature of the semiconductor laser device and the output power in the first embodiment. FIG. 6 is an explanatory diagram illustrating the pulses that are generated by the driving circuit in the first embodiment. FIG. 7 is an explanatory diagram illustrating a warning notification screen in the first embodiment. The output power control process is implemented by the controller 170 controlling the various functional blocks.

The controller 170 acquires the temperature T of the semiconductor laser device 100a from the temperature sensor 130 (Step S10). Specifically, the temperature sensor 130 measures the temperature Ts of the base plate of the semiconductor laser device 100a to which the temperature sensor 130 is attached, and the controller 170 acquires the temperature Ts measured by the temperature sensor 130 from the temperature sensor 130 at specific time intervals.

The controller 170 determines whether or not the temperature Ts is in a range between threshold $T_{th1}$ and threshold $T_{th2}$ (Step S11). If in the range between threshold $T_{th1}$ and threshold $T_{th2}$ (Step S11: Yes), then it is determined that there is no need to change the setting for the laser output power, and the temperature Ts is again acquired from the temperature sensor 130. If not in the range between threshold $T_{th1}$ and threshold $T_{th2}$ (Step S11: No), then it is determined whether or not the temperature Ts is less than threshold $T_{th1}$ (Step S12). If less than threshold $T_{th1}$ (Step S12: Yes), then the controller 170 determines that the laser output power is less than the desired power setting, and increases the output power of the semiconductor laser device (Step S13). Note that even though the controller 170 determines whether or not the output power is the desired power based on the temperature Ts, the determination as to whether or not the output power of the semiconductor laser device is the desired power may instead be made by directly measuring the output power and making the determination based on the temperature Ts, the output power, or both.

If the temperature Ts is not lower than threshold $T_{th1}$ (Step S12: No) then the controller 170 compares the temperature Ts with the threshold $T_{th3}$ (Step S14), and if the temperature Ts is lower than the threshold $T_{th3}$, or in other words, if the temperature Ts is higher than the threshold $T_{th2}$ and lower than the threshold $T_{th3}$ (Step S14: No), then the output power of the semiconductor laser device 100a is reduced according to the temperature Ts (Step S15). Specifically, a drive signal control module 171 references the correspondence table 510 shown in FIG. 5 and adjusts the amount of power supplied from the power supply driving circuit 150a to the semiconductor laser device 100a so that the output power from the semiconductor laser device 100a will be the output power corresponding to the temperature Ts.

The correspondence table 510 will be explained in reference to FIG. 5. In the correspondence table 510, the vertical axis shows the sensor temperature, and the horizontal axis shows the output power of the semiconductor laser device 100a. For example, this shows that if the sensor temperature Ts is at or below the temperature T3 (the range P3 shown in FIG. 5), the output power per unit time of the semiconductor laser device 100a will be the output power PW3.

Moreover, when the sensor temperature Ts is such that T3<Ts≦T2 (the range P2 shown in FIG. 5), then with the increase in temperature, the output power from the semiconductor laser device 100a will be reduced from the output power PW3 to the power PW2 at a rate of Δd1. Note that Δd1=|(PW2−PW3)/(T2−T3)|.

Additionally, if the temperature Ts of the temperature sensor 130 is such that T2<Ts≦T1 (the range P1 shown in FIG. 5), then with the increase in temperature, the output power from the semiconductor laser device 100a will be reduced from the output power PW2 to the power PW1 at a rate of Δd2. Note that Δd2=|(PW1−PW2)/(T1−T2)| and Δd2>Δd1.

Moreover, if the temperature Ts of the temperature sensor 130 is such that Ts>T1 (the range P0 shown in FIG. 5), then the power supplied to the semiconductor laser device 100a is PW1, and if Ts≧T0, the power supplied to the semiconductor laser device 100a is zero, or in other words, no power is supplied to the semiconductor laser device 100a.

For example, the drive signal control module 171 references the correspondence table 510 when the sensor temperature Ts is obtained and, as shown in FIG. 5, obtains the output power PWs corresponding to the sensor temperature Ts, and controls the power supply driving circuit 150a so that the output power per unit time of the semiconductor laser device 100a will be the output power PWs.

Here the supply of power to the semiconductor laser device 100a from the power supply driving circuit 150a will be explained in reference to FIG. 6. The power supply driving circuit 150a supplies power through applying a pulse voltage to the semiconductor laser device 100a. Moreover, the power supply driving circuit 150a adjusts the power supplied to the semiconductor laser device 100a by changing the pulse width and amplitude (voltage) through pulse modulation.

The power supply driving circuit 150a, as shown in FIG. 6, supplies the pulse waveform 200 to the semiconductor laser device 100a during normal operation (range P3 shown in FIG. 5). The pulse waveform 200 is generated so that the period will be S, the pulse width D will be W1, and the amplitude A will be A1. The amplitude A indicates the voltage applied by the power supply driving circuit 150a. When the pulse waveform 200 is applied for one period to the semiconductor laser device 100a, the power PW shown by the diagonal line in FIG. 6 will be applied to the semiconductor laser device 100a.

For example if, as shown in FIG. 5, the output power corresponding to the sensor temperature Ts is PWs (where PWs<PW3), then the drive signal control module 171 will control the power supply driving circuit 150a so as to reduce the power that is supplied to the semiconductor laser device 100a from the power supply driving circuit 150a. The power supply driving circuit 150a, in response to control by the drive signal control module 171, generates a pulse waveform 210 wherein the pulse width D that is narrowed from W1 to W2 (where W1>W2), which is supplied to the semiconductor laser device 100a.

The explanation will continue, returning to FIG. 4. The controller 170, after finishing adjusting the output power of the semiconductor laser device 100a, returns to Step S10, and the process is repeated.

The controller 170 compares the acquired temperature T with the threshold value $T_{th3}$ (Step S14), and if the temperature T is greater than the threshold value $T_{th3}$ (Step S14: Yes), then the warning notification module 172 displays a warning, onto the screen 90 through the light valves 60, that the power of the semiconductor laser device 100a will be turned off (Step S16). A warning notification message 91 is displayed on the screen 90, as shown in FIG. 7. The period of the display is a period that is adequately long for the notification, and may be, for example, about 10, 20, and 30 seconds long. Note that in the present embodiment, temperature $T_{th1}$<temperature $T_{th2}$<temperature $T_{th3}$, where the temperature $T_{th2}$ is temperature T3, and the temperature $T_{th3}$ is temperature T0.

After the display period of the warning notification has elapsed, the drive signal control module 171 stops the supply of power to the semiconductor laser device 100a, and the output of the semiconductor laser device 100a stops (Step S17).

Given the first embodiment, described above, increases in temperature of the semiconductor laser device is able to be prevented through reducing the output power by controlling the amount of power supplied to the semiconductor laser device. As a result, it is possible to prevent reductions in the service life of the semiconductor laser device, even when there is a failure in a cooling device that cools the semiconductor laser device, and even when the device is used in a high temperature environment (such as an environment in excess of 40° C.) not envisioned at the time of manufacturing. Moreover, given the first embodiment, it is possible to increase the output power in response to drop in temperature of the semiconductor laser device, making it possible to control reductions in output power. In addition, given the first embodiment, it is possible to measure with excellent accuracy the temperature of the semiconductor laser device because the temperature sensor is attached to the base plate of the semiconductor laser device.

While the brightness is reduced because the output power from the semiconductor laser device drops in accordance with the increase in the temperature, it is known that the human eye is able to judge as essentially no change in brightness when there is a minor change in brightness (for example, of about 10% or less). Consequently, the first embodiment, described above, enables the prevention of abrupt breakdown rapid burnout of the semiconductor laser device, enabling improved utility for the users and the viewers.

Additionally, given the first embodiment, when the temperature crosses the threshold value, the supply of power to the semiconductor laser device is cut off, and the output of the semiconductor laser device is stopped. Consequently, it is possible to prevent the shortened life expectancy of the semiconductor laser device that would result from continuous high-temperature operation. Additionally, given the first embodiment, described above, a warning display that the operation will stop is displayed on the screen 90 when the operation of the semiconductor laser device is to be stopped, making it possible to improve the convenience for the users and viewers.

B. Second Embodiment

In the second embodiment, a temperature sensor is disposed on a light source mount member to which the semiconductor laser device is attached.

B1. Detailed Structure of the Light Source Device

Figure 8:
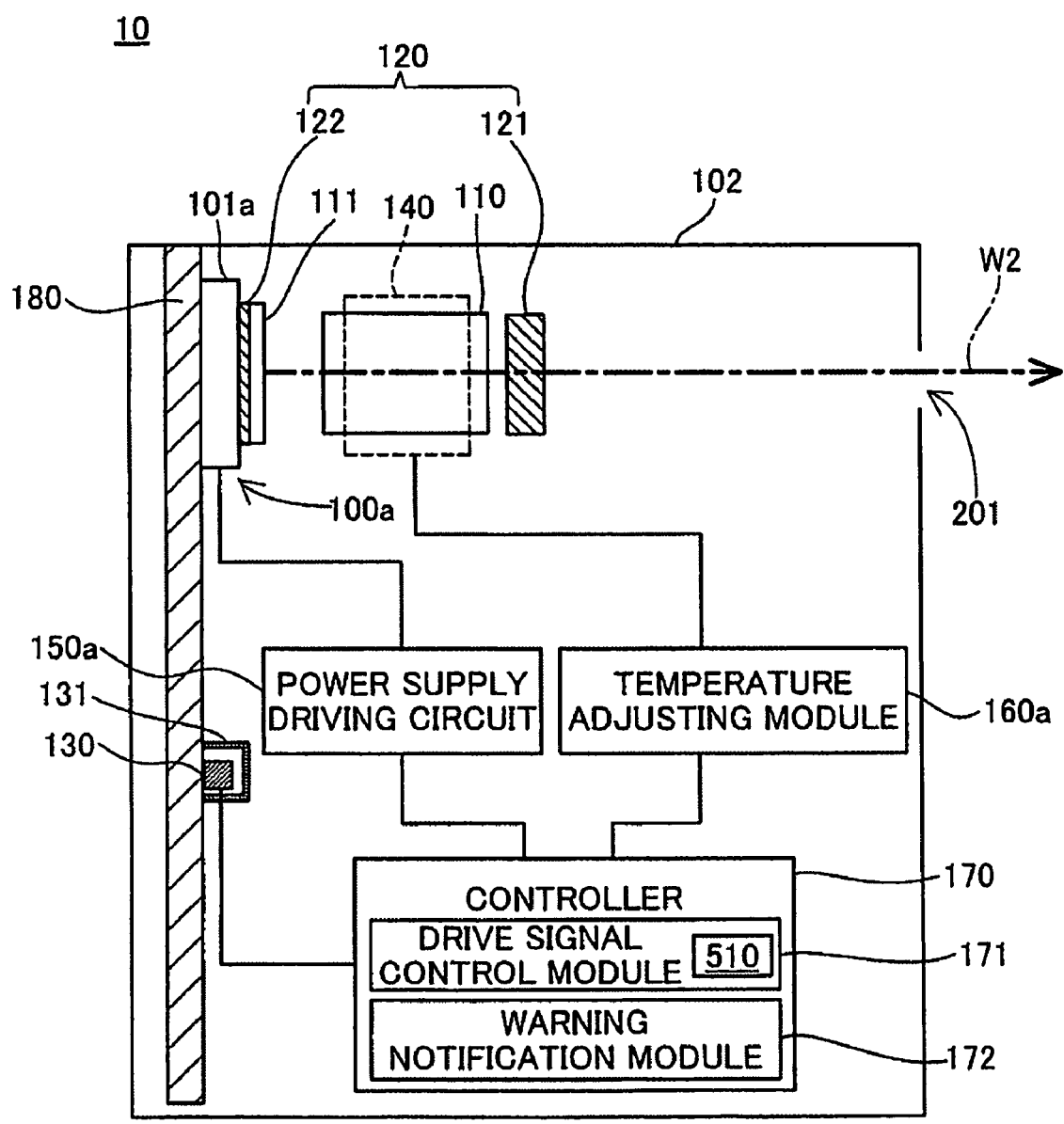
FIG. 8 illustrates a block diagram of the structure of a light source device as set forth in a second embodiment.

A light source device in a second embodiment will be described in reference to FIG. 8. As is shown in FIG. 8, the light source device of the second embodiment is provided with a light source mount member 180 and a sensor cover 131 in addition to each of the function blocks of the light source device of the first embodiment. Note that the structure of the light source in the second embodiment is provided with the same structures and functions as in the first embodiment, with the exception of the light source mount member and the temperature sensor attachment location, so explanations of redundant portions will be omitted.

The light source mount member 180 is made from a resin with thermostability and high thermal conductivity, and a black-colored coating has been applied. The semiconductor laser device 100*a* and the temperature sensor 130 are attached to the light source mount member 180. The temperature sensor 130 may be attached to any position on the light source mount member 180.

The sensor cover 131 is made from a resin with thermostability, and prevents the laser beam that remains within the light source device 10, without being outputted to the outside (termed the "stray light" in the present specification), from striking the temperature sensor 130. When the sensor is struck by a laser beam that is stray light, there would be the risk that the temperature of the light source mount member 180 would not be measured accurately. In other words, the accuracy of the measured temperature would be reduced, which would reduce the accuracy of the control of the output power of the semiconductor laser device 100*a*. Consequently, the provision of the sensor cover 131 enables the accurate measurement of the temperature of the light source mount member 180.

B2. Output Power Control

In the second embodiment, the temperature sensor 130 measures the temperature of the light source mount member 180. The drive signal control module 171 of the controller 170 acquires the temperature of the light source mount member 180 from the temperature sensor 130. The drive signal control module 171 has relational information that establishes the correlation between the acquired temperature of the light source mount member 180 and the output power of the semiconductor laser device 100*a* corresponding to that temperature. The relational information may be a table that establishes the correspondence between the temperature and the output power, for example, as with the correspondence table 510 in the first embodiment, or may be a mathematical function for temperature as a function of the output power. When a mathematical function is used, preferably the mathematical function that is used spikes at the temperature.

Because the light source mount member 180 has high thermal conductivity, there is a high correlation with the temperature of the semiconductor laser device 100*a* that is attached thereto. Consequently, in the second embodiment described above, the temperature of the semiconductor laser device is able to be acquired with high accuracy, making it possible to control the output power of the semiconductor laser device accurately, making it possible to suppress temperature increases in the semiconductor laser device. Consequently, it is possible to prevent reductions in the service life of the semiconductor laser device.

Furthermore, in the second embodiment, described above, the temperature sensor is disposed on the light source mount member to which the semiconductor laser device is attached, thus enabling the structure to be positioned easily, with less damage to the semiconductor laser device, than if positioned on the delicate semiconductor laser device, which has little ability to withstand physical shocks.

C. Third Embodiment

In a third embodiment, not only is the temperature of the semiconductor laser device measured, but also the beam intensity of the visible beam that is outputted from the light source device is measured, and the output powers of the semiconductor laser devices 100*a*, 100*b*, and 100*c* of the three light source devices 10, 20, and 30 are controlled based on the temperatures and the beam intensities. The structure of the projector in the third embodiment is essentially identical to the structure of the projector in the first embodiment, explained with FIG. 1.

C1. Detailed Structure of the Light Source Device

The functional blocks of the light source device in the third embodiment will be explained in reference to FIG. 9. Note that for convenience in the figure, the power supply driving circuits for the light source devices 20 and 30, and structures aside from the temperature adjusting modules, are omitted.

Figure 9:
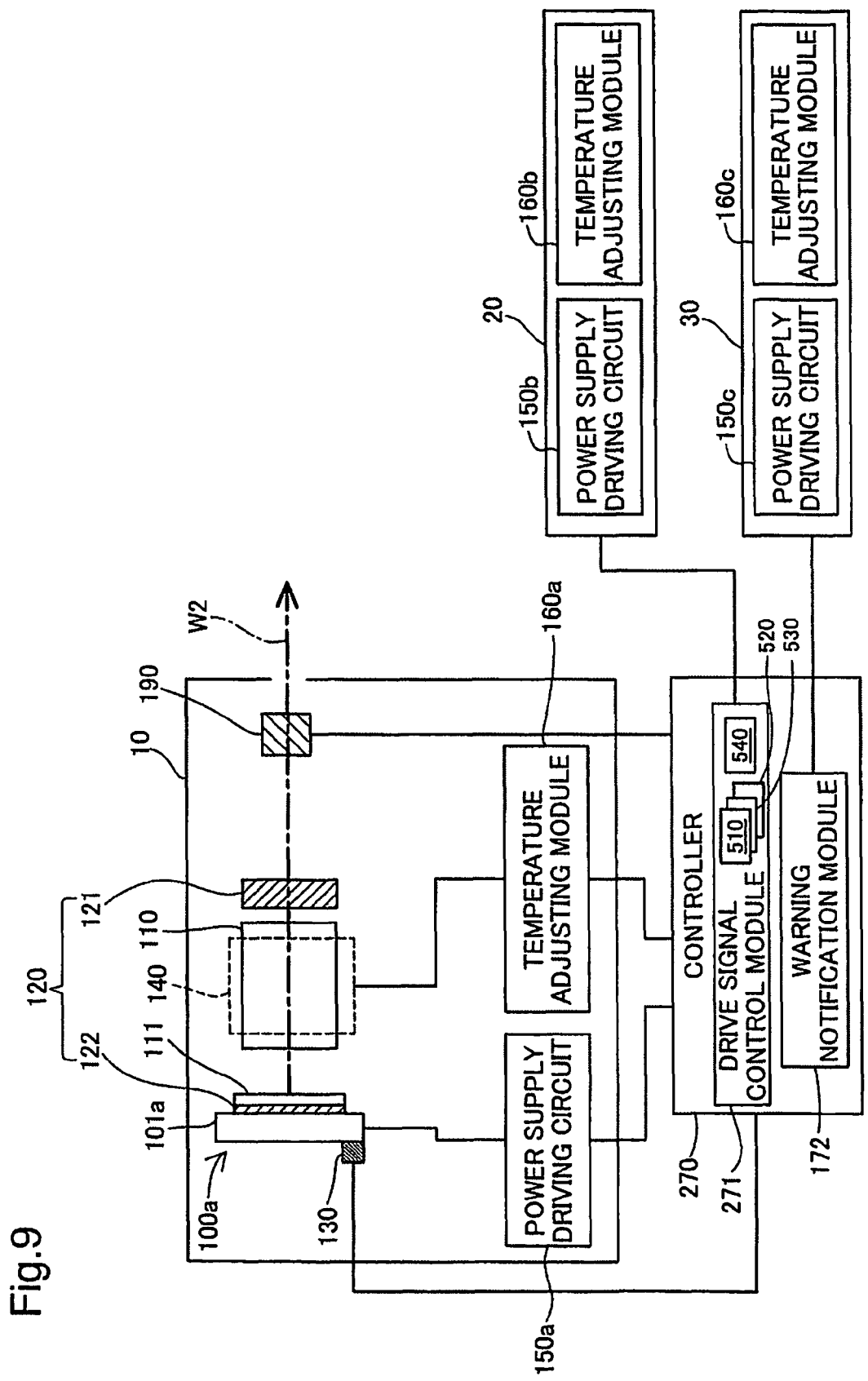
FIG. 9 illustrates a block diagram of the structure of the light source device in the third embodiment.

As shown in FIG. 9, the light source device 10 comprises a semiconductor laser device 100*a* as a laser beam source, a second harmonic generating element 110, a resonator 120, a temperature sensor 130, a temperature adjusting device 140, a power supply driving circuit 150*a*, a temperature adjusting module 160*a*, and a controller 270. the controller 270 comprises a drive signal control unit 271, a warning notification module 172, and a laser power meter 190 as beam intensity measurement means. In the various structures in the third embodiment, there are the same structures and functions as the structures with the identical codes in the first embodiment, so explanations thereof are omitted.

The laser power meter 190 is provided with a photosensitive unit, and is a device for converting, into an electric signal, the energy of the laser beam that is incident on the photosensitive unit. The photosensitive unit is structured from, for example, a silicon photodiode. The laser power meter 190 may be positioned on the path of the beam between the second harmonic generating element 110 and the cover opening part 201 of the light source device, or may be positioned in a location that is able to receive light having energy equivalent to that of the energy of the beam that passes along the beam path, even if not positioned on the actual beam path.

The drive signal control unit 271 of the controller 270 comprises correspondence tables 510, 520, and 530 for the individual light source devices 10, 20, and 30, and a white balance table 540. The drive signal control unit 271 acquires the temperatures of each of the semiconductor laser devices from the respective light source device temperature sensors, and with the minimum temperature as reference temperature $T_{min}$ and the maximum temperature as reference temperature $T_{max}$, controls the output power of the semiconductor laser devices by adjusting the amount of power supplied to the light-emitting elements from the power supply driving circuit of the light source device based on the reference temperatures and on the correspondence tables of the light source devices having the reference temperatures.

Furthermore, the drive signal control unit 271 controls the output powers of the semiconductor laser devices of the other light source devices based on the beam intensity after output power adjustment for the light source device with the reference temperature by referencing the white balance table 540 to ensure the white balance of the light that is outputted from the three light source devices. The white balance refers to causing a desirable white color to be produced by adjusting the state of color production for the various colors, or in other words, adjusting the color intensities, when producing a white color by combining red light, green light, and blue light. When the balance of the color intensities of the various colors is lost, there will be a bias in the white balance, producing, for example, a "white" color wherein the red color is strong, or producing a "white" color wherein the blue color is strong, where maintaining the color intensities of each of the colors in a specific balance makes it possible to display, on the screen 90, an image with a desired color balance wherein there is little color biasing. The white balance table 540 is a table that defines this white balance.

Note that the controller 270 controls all three of the light source devices 10, 20, and 30. The controller 270 may be structured in any of the light source devices, or it may be structured outside of the three light source devices. Moreover, the controller 270 may be structured within all of the light source devices, where the control unit for the light source device with the highest temperature may control the other light source devices.

C2. Output Power Control Process

Figure 10:
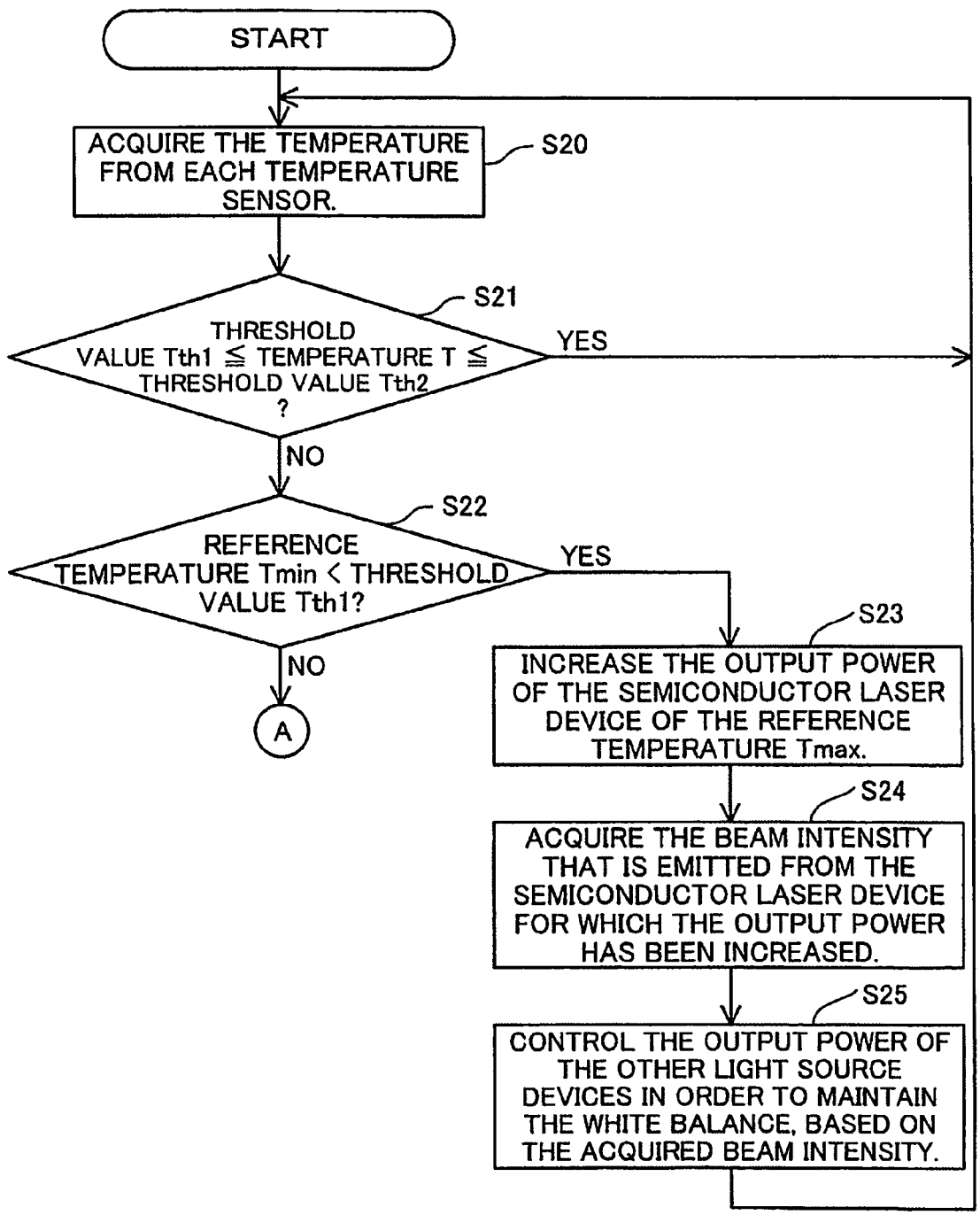
FIG. 10 shows a flowchart for explaining the output power control process in the third embodiment.
Figure 11:
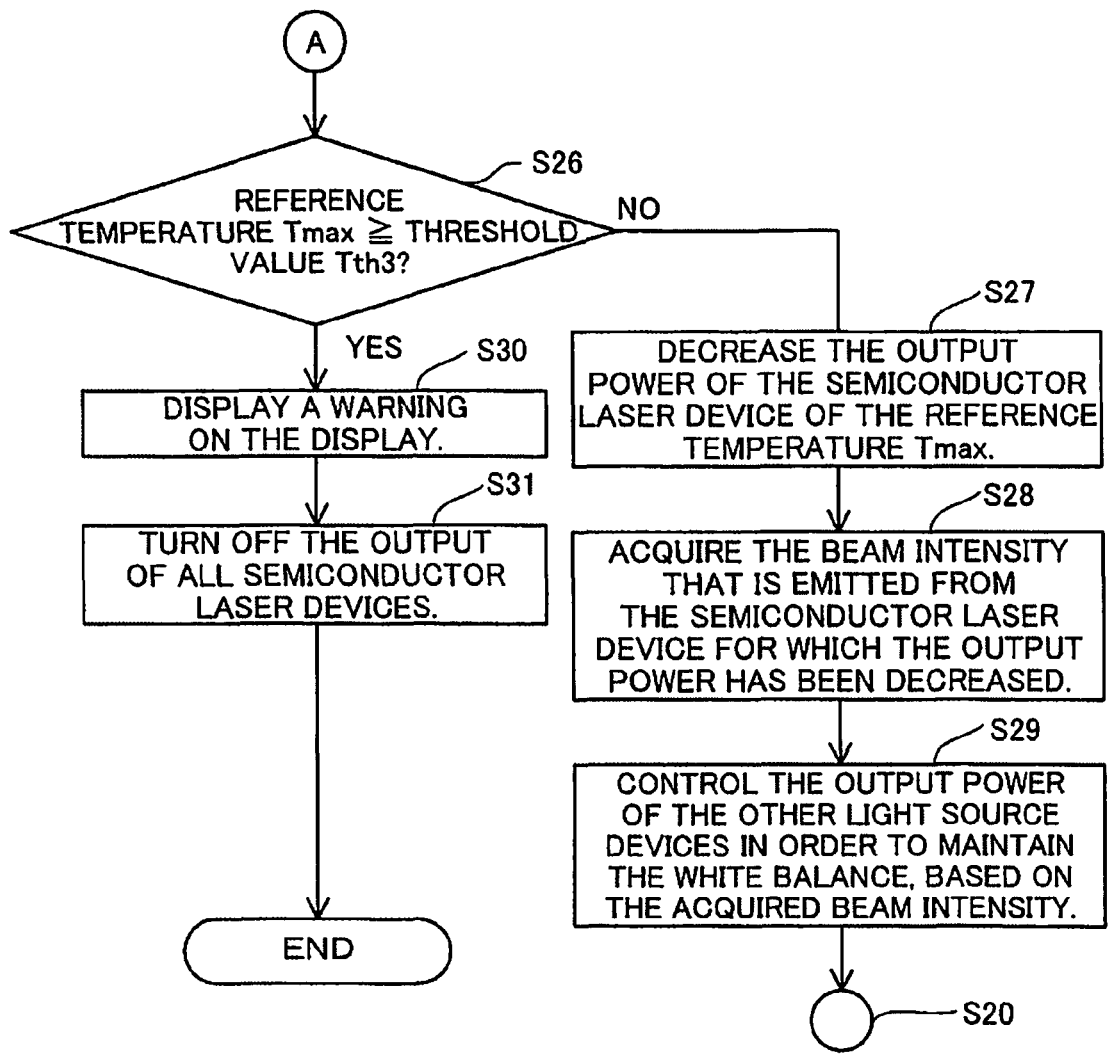
FIG. 11 shows a flowchart for explaining the output power control process in the third embodiment.

The output power control process in the third embodiment will be explained referencing FIG. 10 and FIG. 11. FIG. 10 and FIG. 11 are flowcharts for explaining the output power control process in the third embodiment.

The controller 270 acquires the temperature T of each of the semiconductor laser devices from the temperature sensors 130 in all of the light source devices (Step S20).

The controller 270 determines whether or not the temperatures T of each of the semiconductor laser devices are in the range between threshold $T_{th1}$ and threshold $T_{th2}$ (Step S21). If in the range between threshold $T_{th1}$ and threshold $T_{th2}$ (Step S21: Yes), then it is determined that there is no need to change the setting for the laser output power, and the temperatures T are again acquired from the temperature sensor 130s. If not in the range between threshold $T_{th1}$ and threshold $T_{th2}$ (Step S21: No), then it is determined whether or not the reference temperature $T_{min}$ with the lowest temperature, of the temperatures T for all of the semiconductor laser device temperatures T, is less than threshold $T_{th1}$ (Step S22). If $T_{min}$ is less than threshold $T_{th1}$ (Step S22: Yes) then the controller 270 determines that the output power for the semiconductor laser device of the reference temperature $T_{min}$ is less than the desired power setting, and increases the output power of the applicable semiconductor laser device (Step S23).

The controller 270 acquires the beam intensity of the beam that has been converted into visible light, after having been emitted from the semiconductor laser device for which the output power had been increased (Step S24). Specifically, the controller 270 acquires the beam intensity of the visible light from a laser power meter 190.

The drive signal control unit 271 references the white balance table 540 based on the acquired beam intensity and adjusts the output powers of the semiconductor laser devices of the other light source devices so as to ensure a white balance in the light that is outputted from the three light source devices (Step S25). Specifically, the drive signal control unit 271 has a white balance table 540 that defines the proportions of the beam intensities for each of the colors so as to ensure a white balance between the three colors, those being the red light outputted from the light source device 10, the green light outputted from the light source device 20, and the blue light outputted from the light source device 30, where the white balance table 540 is referenced to control the output powers in the other light source devices.

If the reference temperature $T_{min}$ is not lower than threshold $T_{th1}$ (Step S22: No) then the controller 270 compares the reference temperature $T_{max}$ which is the highest temperature of the temperatures T acquired for each of the semiconductor laser devices, to the threshold $T_{th3}$ (Step S26), and if the reference temperature $T_{max}$ is lower than the threshold $T_{th3}$, or in other words, if the reference temperature $T_{max}$ is higher than the threshold $T_{th2}$ and lower than the threshold $T_{th3}$ (Step S26: No), then the output power of the semiconductor laser device for the reference temperature $T_{max}$ is reduced (Step S27).

The controller 270 acquires the beam intensity of the light that is converted into visible light, after being emitted from the semiconductor laser device after the output power has been reduced (Step S28).

The drive signal control unit 271 references the white balance table 540 based on the acquired beam intensities and adjusts the output powers of the semiconductor laser devices of the other light source devices so as to ensure the white balance of the light that is outputted from the three light source devices (Step S29).

After finishing adjusting the output powers of the semiconductor laser devices 100a by controlling the power supplied to the semiconductor laser devices 100a according to the sensor temperatures Ts, the controller 270 returns to Step S20, and the process is repeated.

If the reference temperature $T_{max}$ is at or above the threshold temperature $T_{th3}$ (Step S26: Yes), then the warning notification module 172 of the controller 270 displays, on the screen 90 through the light valves 60 for a specific amount of time, a warning that the operations of all of the semiconductor laser devices is going to be stopped (Step S30).

After the display period has elapsed, the drive signal control unit 271 of the controller 270 stops the supply of power to the semiconductor laser devices of all of the light source devices, and the output of the semiconductor laser devices stops (Step S31).

The third embodiment, described above, makes it possible to control the output power of the semiconductor laser devices of the other light source devices according to the control of the output power of the semiconductor laser device in one light source device based on the rise in temperature of that semiconductor laser device in a projector that uses a plurality of light source devices, making it possible to ensure the white balance. Consequently, not only is it possible to prevent shortened service life of the semiconductor lasers, but also possible to project a high-quality image wherein the white balance is ensured when projecting an image onto a screen using a plurality of semiconductor laser devices.

D. Fourth Embodiment

Figure 12:
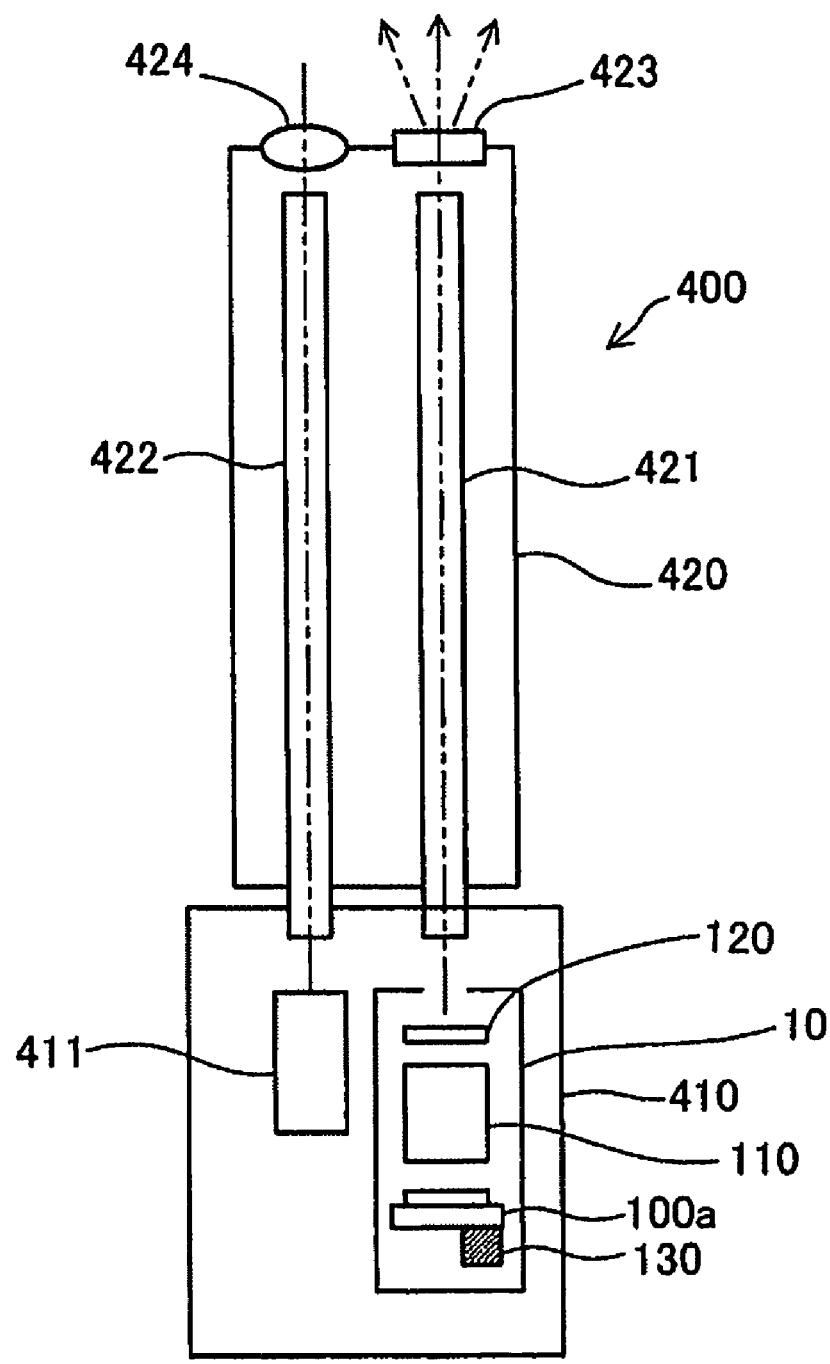
FIG. 12 illustrates an explanatory diagram of a monitor device as set forth in a fourth embodiment.

In the fourth embodiment, an explanation will be given regarding a monitor device provided with a light source device. FIG. 12 is an explanatory diagram illustrating a monitor device 400 in the fourth embodiment. The monitor device 400 comprises a device main unit 410, and an optical transport unit 420. The device main unit 410 comprises the light source device 10 of the first embodiment, described above. The light source device 10, as explained in the first embodiment, comprises a semiconductor laser device 100a, a second harmonic generating element 110, and a resonator 120. Note that in the present embodiment, the semiconductor laser device 100a outputs a white laser beam.

The optical transport unit 420 comprises two light guides 421 and 422, on the beam sending side and on the beam receiving side. Both light guides 421 and 422 are bundles of a plurality of optical fibers, and is able to convey a laser beam to a remote location. A light source device 10 is disposed on the incident side of the light guide 421 on the beam sending side, with a diffuser plate 423 disposed on the exit side thereof. The laser beam outputted from the light source device 10 passes through the light guide 421 to be conveyed to the diffuser plate 423 that is disposed at the tip of the optical transport unit 420, and is diffused by the diffuser plate 423 to illuminate an object to be photographed.

At the tip of the optical transport unit 420 is disposed a focusing lens 424, which can receive, using the focusing lens 424, the light reflected from the object to be photographed. The reflected light that is received passes through the light guide 422 on the beam receiving side, to be sent to a camera 411, as a photographing means, disposed within the device main unit 410. The result is that it is possible to photograph, using the camera 411, an image based on the reflected light obtained through illuminating the object to be photographed using a laser beam that is emitted from the light source device 10.

The monitor device 400, structured as described above, is able to prevent the increase in temperature of the semiconductor laser device, and is able to prevent the shortening of the service life. Because the monitor device 400 can be used in operating rooms, for example, this is able to increase the utility to the user by being able to prevent sudden failure or sudden loss of light by the semiconductor laser device.

E. Fifth Embodiment

In the first embodiment through the fourth embodiment, degradation of the light source device was prevented through reducing the temperature of the light source device through reducing the power supplied to the light source device. In the fifth embodiment, a light source device will be explained wherein the power that is supplied to the light source device is adjusted without the viewer being aware of a change in brightness, while maintaining a uniform white balance, after starting up the light source device.

E1. Detailed Structure of the Light Source Device

Figure 13:
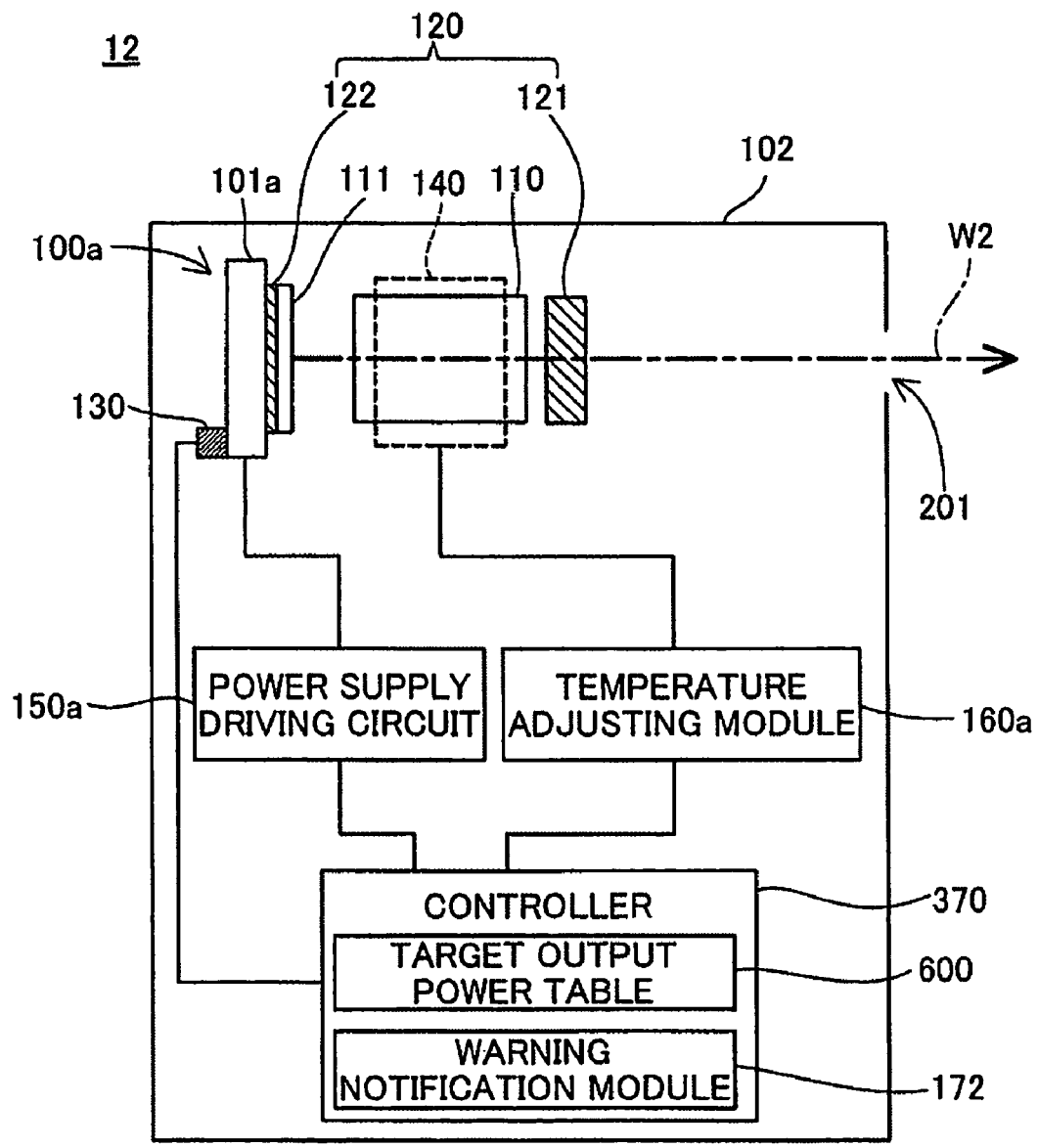
FIG. 13 illustrates a block diagram of the structure of a light source device as set forth in a fifth embodiment.

FIG. 13 is a block diagram illustrating the structure of a light source device in a fifth embodiment. The light source device 11 as set forth in the fifth embodiment is provided with a structure that is identical to that of the light source device 10 in the first embodiment, except for the process by the controller 370.

E2. Output Power Control Process

Figure 14:
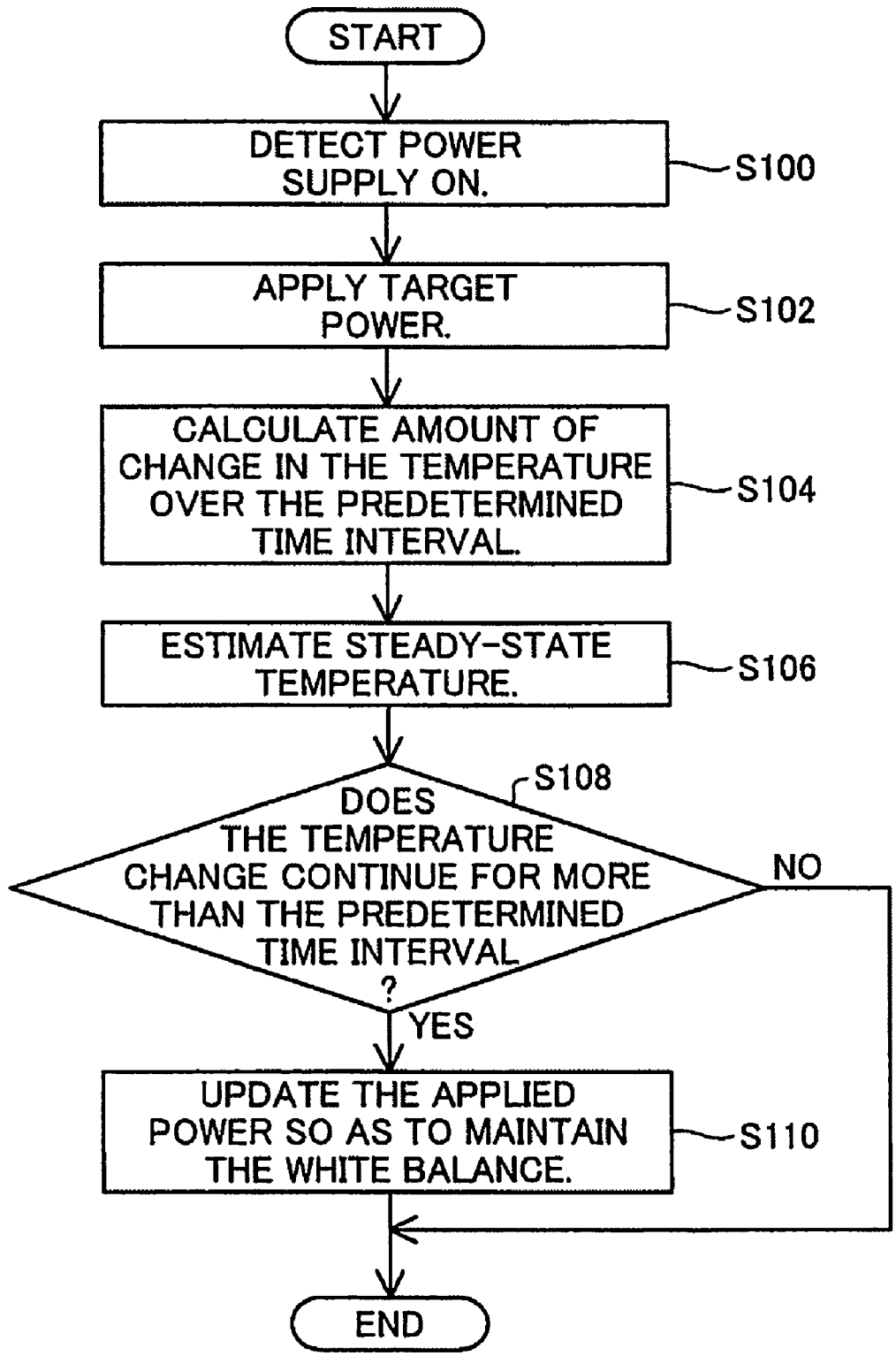
FIG. 14 shows a flowchart for explaining the output power control process in the fifth embodiment.
Figure 16:
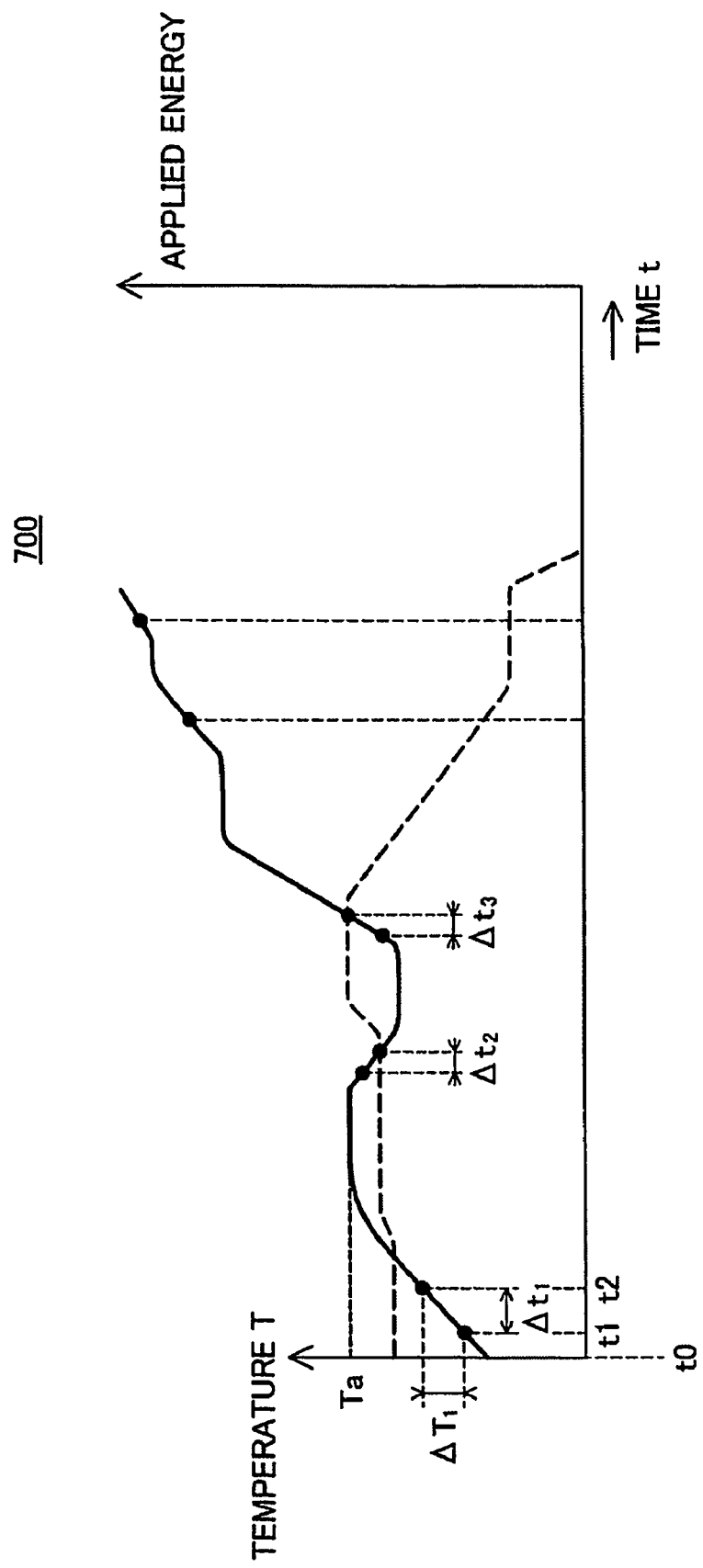
FIG. 16 shows a graph of the correlation over time of changes in temperatures in the light source devices and the output powers in the fifth embodiment.
Figure 17:
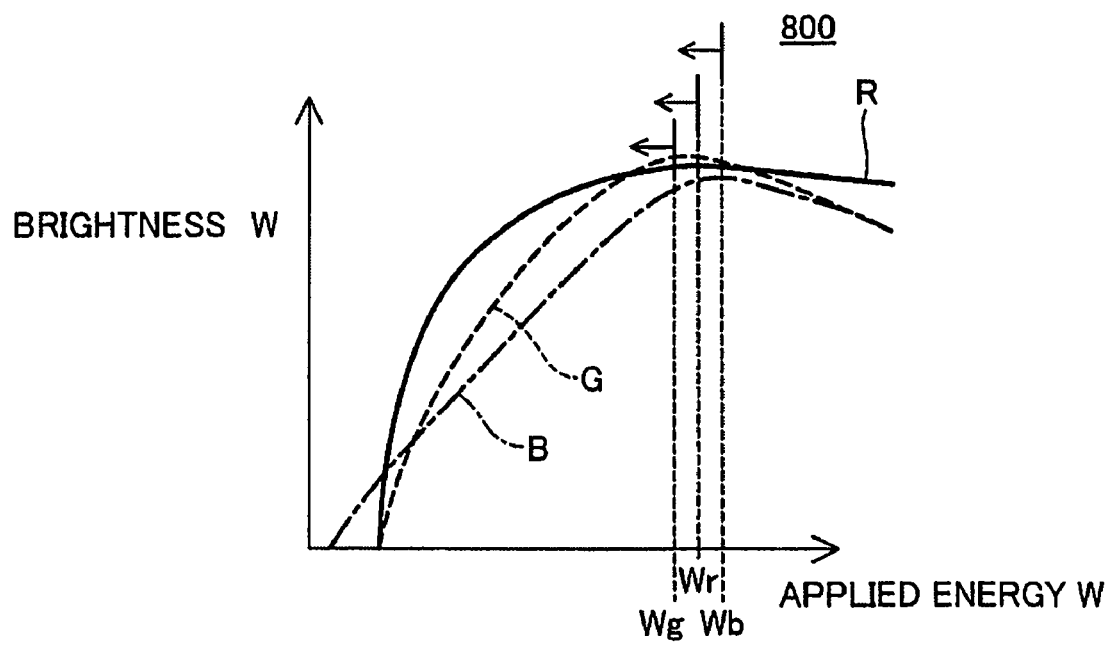
FIG. 17 shows a characteristic graph of the applied power for each of the color light sources and the brightness thereof in the fifth embodiment.
Figure 18:
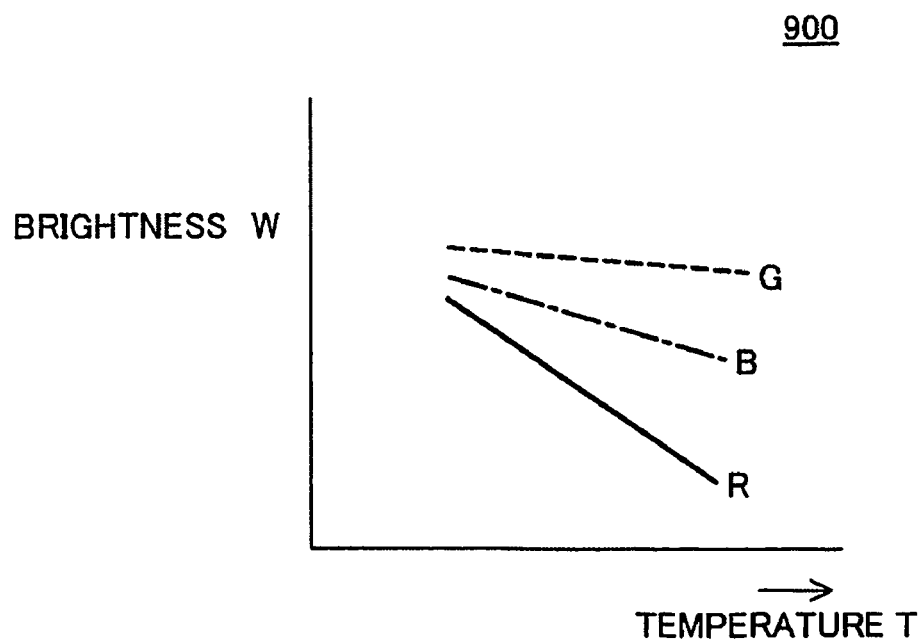
FIG. 18 shows a graph of the temperature dependence of the brightness of the light sources for each of the colors in the fifth embodiment.

The output power control process in the fifth embodiment will be explained in reference to FIG. 14 through FIG. 18. FIG. 14 is a flowchart for explaining the output power control process in the fifth embodiment. FIG. 15 is an explanatory diagram illustrating a target output power table in the fifth embodiment. FIG. 16 is a graph illustrating the correlation over time of the change in temperature of the light source device and the output power in the fifth embodiment. FIG. 17 is a characteristic graph illustrating the characteristics of the input power and the brightness of the light sources of each of the colors in the fifth embodiment. FIG. 18 is a graph showing the temperature dependency of the brightness of the light sources for each of the colors in the fifth embodiment.

When the controller 370 detects that the power of the light source device 11 has been turned on (Step S100), the temperature of the semiconductor laser device 100a is acquired from the temperature sensor 130, and a target output power, which is the output power that is specified according to the acquired temperature, is provided (Step S102). Specifically, the controller 370 references a target output power table 600 wherein is set the temperatures of the semiconductor laser device 100a and the target output powers, and the target output power is sent to the semiconductor laser device 100a.

As is shown in FIG. 15, the target output power table 600 is structured from the items of "Temperature" and "Target output power," where target output powers are set for the red light source, the blue light source, and the green light source, individually, depending on the temperature of the semiconductor laser device 100a. For example, if the temperature acquired from the temperature sensor 130 is "C," then the target output power for the red light source would be "cR," the target output power for the blue light source would be "cB," and the target output power for the green light would be "cG." Note that in the fifth embodiment, the target output powers of the laser devices for the other colors are determined based on the temperature acquired from the temperature sensor for the red laser device. The controller 370 determines the target output powers at startup in this way.

The controller 370 calculates the amount of change in temperature over a specific time interval (Step S104), and estimates the temperature of the semiconductor laser device 100a in the steady state (hereinafter termed the "steady-state temperature" in the fifth embodiment) (Step S106).

The controller 370 determines whether or not the amount of change in temperature that has changed in a predetermined time period is equal to or greater than a predetermined value (Step S108). If the amount of change in temperature is equal to or greater than the predetermined value (Step S108: Yes), then the voltage supplied to the power supply driving circuit is changed so as to maintain the white balance, which is the balance between temperatures for each of the colors in the red light source, the blue light source, and the green light source, uniformly (Step S110). The controller 370 ends the process if the amount of change in temperature is not greater than or equal to the predetermined value (Step S108: No).

In graph 700 of FIG. 16, the graph with the solid line shows the change in temperature of the semiconductor laser device, and the graph with the dotted line shows the applied power. The graph 700 shows the steady-state temperature, which is the temperature in the steady-state condition wherein the temperature Ta has stabilized at a constant temperature. As is shown in FIG. 16, the controller 370 calculates the increase in temperature $\Delta T1$ of the semiconductor laser device in the constant time period $\Delta t1$, estimates the steady-state temperature, and uses the estimated steady-state temperature and the target output power table 600 to set the target output power for the steady-state temperature, and controls the voltage supplied to the power supply driving circuit 150a so as to reach that target output power. Here, while the controller 370 maintains the white balance, the controller 370 controls the voltages supplied to the power supply driving circuits 150a so that the change in brightness of each of the light sources will have a slope of no more than 2% per 1/60 seconds, or in other words, so that the difference in temperature after the change relative to the temperature before they change will be no more than about 2% every 1/60 seconds. The target output powers are updated only if the change in temperature over a predetermined time period is equal to or greater than the specific value, thereby preventing the target output power from being changed too frequently.

In the characteristic graph 800 in FIG. 17, the vertical axis shows the brightness of each of the color laser devices, and the horizontal axis shows the applied power. As is shown in FIG. 17, the red laser device will achieve a maximum brightness at the applied power of Wr, the blue laser device will achieve a maximum brightness at the applied power of Wb, and the green laser device will achieve a maximum brightness at the applied power of Wg, so that even if power in excess of these applied powers Wr, Wb, and Wg were applied, the brightness of each of the colored laser devices would diminish (where these applied powers Wr, Wb, and Wg are known as "rollover points" of the respective color light source devices). Because the individual laser devices have these types of properties, the controller 370 implements control so as to drive each individual color laser device at a power less than the respective rollover point.

Additionally, in the graph 900 in FIG. 18, the vertical axis shows the brightness of the semiconductor laser device and the horizontal axis shows the temperature of the semiconductor laser device. As is shown in FIG. 18, the rate of reduction of the brightness of the red laser device relative to the increase in temperature is greater than that of the blue laser device or the green laser device. That is, it is in the red laser device that the temperature dependency is the worst. Consequently, in the fifth embodiment the controller 370 changes the power that is applied to the blue laser device and to the green laser device in coordination with the amount of change in the red laser device when maintaining a constant white balance when changing the input power.

The light source device in the fifth embodiment, as described above, is able to control the power that is supplied to the semiconductor laser device so that the brightness of the semiconductor laser device will follow a slope of no more than 2% per 1/60 seconds. Changing the brightness with this slope enables the brightness of the overall image to be changed without the viewer being aware of the change in brightness. Consequently, this enables control of the supplied power while providing an image that does not seem odd to the viewer.

Moreover, the light source device in the fifth embodiment enables the adjustment of the target output power of the other light source devices in coordination with the light source device that has the worst temperature dependency among the multiple light source devices. Consequently, it becomes possible to maintain a constant white balance efficiently using a simple structure. Note that while in the fifth embodiment the light sources for the other colors were coordinated with the red light source, this is not a limitation.

Moreover, the light source of the fifth embodiment enables the operation of the semiconductor laser device at a power of less than the rollover point, thus enabling power to be provided efficiently, and making it possible to prevent degradation of the light source device.

Furthermore, in the fifth embodiment is possible to limit updates to the target output power to only those times when the change in temperature over a predetermined time interval is greater than a predetermined value. This makes it possible to prevent changes in the target output power caused by slight changes in temperature.

F. Modified Examples (1) While in the first embodiment, described above, the power supply driving circuit 150a modulated the pulse width, instead, for example, the power supply driving circuit 150a may generate a pulse waveform wherein the amplitude (voltage) is modulated, and may provide that to the semiconductor laser device. In the case of this modified example, preferably the power supply driving circuit 150a is provided with means for changing the amplitude (voltage). The power supply driving circuit 150a may generate a pulse waveform 220 wherein the amplitude (voltage) is reduced (where the pulse width A=A2, A1>A2), and may provide this to the semiconductor laser device 100a. Although the amount of power that is supplied to the semiconductor laser device 100a may be reduced by either narrowing the pulse width or by reducing the pulse amplitude, the pulse waveform 210, wherein the pulse width is narrowed, is more preferable than the pulse waveform 220 because the peak energy is higher.

(2) While in the first embodiment described above control was such that the output power of the semiconductor laser device was reduced continuously according to the increase in the temperature of the semiconductor laser device, instead the output power of the semiconductor laser device may be reduced discontinuously.

Figure 19:
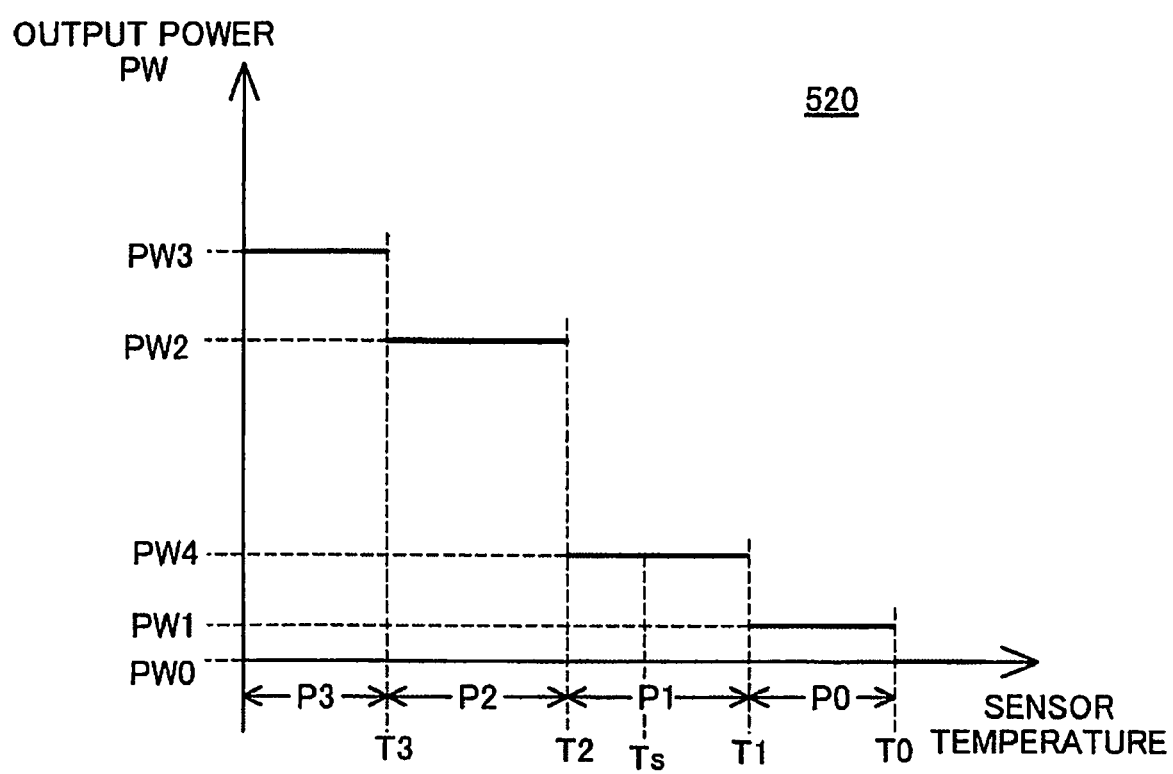
FIG. 19 illustrates a table for defining the correspondence of the output power and the sensor temperature in a semiconductor laser device in a modified example.

FIG. 19 is a correspondence table 520 that defines the correspondence between the output power and the sensor temperature in the modified embodiment. In the correspondence table 520, the vertical axis shows the sensor temperature and the horizontal axis shows the output power of the semiconductor laser device 100a. As is shown in FIG. 19, the sensor temperatures in the correspondence table 520 are divided into a plurality of ranges, range P0 (T1<sensor temperature Ts≦T2), P1 (T2<sensor temperature Ts≦T1), P2 (T3<sensor temperature Ts≦T2), and P3 (T3>sensor temperature Ts), where, if the sensor temperature is within any given range, control is implemented so that the semiconductor laser device will output a uniform output power. For example, as shown in FIG. 19, if the sensor temperature Ts is in the range P1, then the controller 170 supplies power to the semiconductor laser device so that the output of the semiconductor laser device will be the output power PW4.

The modified examples described above make it possible to increase the speed of processing and to reduce the processing load on the controller 170 because the types of pulse signals for producing the power that is supplied to the semiconductor laser device are values that depend on temperature ranges. Moreover, while in the modified examples the temperature ranges were divided into four segments (P0 through P3), instead this may be less than four segments, or may be greater than four segments. If less than four segments, the additional processing can be reduced, increasing the speed of processing, and having more than four segments enables the control to be implemented more flexibly.

(3) While in the third embodiment, described above, there was also control of the semiconductor laser devices for the other light source devices, based on the beam intensity, after controlling the output power of one semiconductor laser device based on the temperature of that semiconductor laser device, instead the output power of the semiconductor laser device may be controlled using either the temperature or the beam intensity in, for example, a projector provided with both a temperature sensor and a laser power meter. Moreover, a laser power meter may be provided, and the output power of the semiconductor laser device may also be controlled based only on the beam intensity, referencing a white balance table 540.

(4) While in the third embodiment, described above, the semiconductor laser devices of the other light source devices are controlled based on the beam intensity after controlling the output power of the semiconductor laser device based on the temperature of the semiconductor laser device of the reference temperature, which is the highest temperature, instead, for example, the output powers of the semiconductor laser devices of the other light source devices may be lowered along with lowering the output power of the semiconductor laser device of the light source device of the reference temperature, without referencing the beam intensity.

(5) The temperature sensor that measures the temperature of the semiconductor laser device that is the light source may be positioned in any position in the light source device. Even if not in direct contact with the semiconductor laser device, it is still possible to acquire the temperature of the semiconductor laser device if located on a member or in a position that has a correlation relationship with the temperature of the semiconductor laser device.

(6) The temperature sensor may be attached to the light-emitting element of the semiconductor laser device directly. Doing so makes it possible to measure the temperature of the semiconductor laser device accurately, enabling increased control precision.

(7) Although in the third embodiment, described above, the beam intensity was measured after conversion into visible light, instead the laser power meter may be disposed at a position that can measure the beam intensity of the light between the semiconductor laser device 100a and the second harmonic generating element, to measure the beam intensity of the light (for example, of infrared light) prior to the conversion into visible light by the second harmonic generating element, to be used in the control of the power of the semiconductor laser device 100a. Because the amount of loss in the light increases depending on the number of intervening optical elements, doing this makes it possible to measure the output power of the semiconductor laser device 100a more accurately.

(8) Although in the first embodiment, described above, a warning notification is implemented when turning off the output of the semiconductor laser device, the warning notification may be implemented at times not limited to turning the semiconductor laser devices off. For example, warning notifications may also be provided when starting to reduce the output of the semiconductor laser device, or when the output has been reduced by more than a specific amount. The method of the notification is not limited to only displaying a message on a screen, but may instead use a variety of forms, such as flashing the screen, displaying a predetermined mark, or the like. Note that the method of notification is not limited to a screen display, but rather the notification may be through a warning sound or audio.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light source device, comprising:
    a first light source having a first temperature;
    a second light source having a second temperature;
    a temperature sensor configured to measure a correlated temperature, the correlated temperature being correlated with the temperatures of the first and second light sources;
    a driving circuit configured to supply electric power to the first and second light sources,
    wherein, in the event that the measured correlated temperature exceeds a first threshold value, the electric power to be supplied to the light source having a higher temperature decreases, and the electric power to be supplied to the light source having a lower temperature also decreases corresponding to the decrease of the electric power to be supplied to the light source with the higher temperature.

2. A light source device as in accordance with claim 1, further comprising:
    a memory that stores relational information for relating the measured correlated temperature with a target electric power to be supplied to the first and second light sources,
    wherein power is supplied to the first and second light sources based on the measured correlated temperature and the relational information.

3. A light source device as in accordance with claim 2, wherein
    the relational information includes a target electric power table for correlating the measured correlated temperature and the target electric power; and
    the driving circuit supplies power to the first and second light sources based on the measured correlated temperature and the target electric power table.

4. A light source device as in accordance with claim 1, wherein, in the event that the measured correlated temperature is lower than a second threshold value, the second threshold value being lower than the first threshold value, the electric power supplied per unit time to the first and second light sources increases.

5. A light source device as in accordance with claim 2, wherein
    in starting up, the electric power per unit time is supplied to the first and second light sources so as to be the target electric power.

6. A light source device as in accordance with claim 4, wherein
    the driving circuit estimates a steady-state temperature using the amount of change of the measured correlated temperature over a predetermined time period, the steady-state temperature being the light source temperature that has reached a steady state, and
    the target electric power is supplied as electric power per unit time to the first and second light sources based on the estimated steady-state temperature and the target electric power table, so that the brightness changes along a slope.

7. A light source device as in accordance with claim 1, wherein, when the measured correlated temperature has changed more than a predetermined amount of change within a predetermined time period, electric power is supplied to the first and second light sources based on the changed light source temperature.

8. A light source device as in accordance with claim 2, wherein
    the target electric power at a first temperature is defined as a first target electric power, the target electric power at a second temperature that is lower than the first temperature is defined as a second target electric power, and the target electric power at a third temperature that is lower than the second temperature is defined as a third target electric power, and
    the relational information includes a first portion wherein the ratio of the difference between the first temperature and the second temperature to the difference between the first target electric power and the second target electric power is larger than the ratio of the difference between the second temperature and the third temperature to the difference between the second target electric power and the third target electric power.

9. A light source device as in accordance with claim 8, wherein
the relational information includes a second portion wherein the target electric power, relative to a temperature at or above a fourth temperature, is zero, the fourth temperature being higher than the first temperature.

10. A light source device as in accordance with claim 1, wherein
the driving circuit supplies the electric power through pulse modulation, and the driving circuit reduces the electric power through either reducing the width of the pulse that is generated by the pulse modulation or reducing the amplitude of the pulse that is generated by the pulse modulation.

* * * * *